United States Patent
Lee et al.

(10) Patent No.: US 9,312,478 B2
(45) Date of Patent: Apr. 12, 2016

(54) MAGNETIC DEVICES AND METHODS OF MANUFACTURING THE SAME

(75) Inventors: Hak-sun Lee, Seoul (KR); Tokashiki Ken, Seongnam-si (KR); Myeong-cheol Kim, Suwon-si (KR); Hyung-joon Kwon, Seongnam-si (KR); Sang-min Lee, Hwaseong-si (KR); Woo-cheol Lee, Suwon-Si (KR); Myung-hoon Jung, Suwon-Si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 751 days.

(21) Appl. No.: 13/589,708

(22) Filed: Aug. 20, 2012

(65) Prior Publication Data

US 2013/0149499 A1  Jun. 13, 2013

(30) Foreign Application Priority Data

Dec. 7, 2011  (KR) .................. 10-2011-0130476

(51) Int. Cl.
*H01L 21/3065* (2006.01)
*H01L 43/12* (2006.01)
*B81C 1/00* (2006.01)
*B82Y 10/00* (2011.01)
*B82Y 25/00* (2011.01)
*G11B 5/31* (2006.01)
*H01L 27/22* (2006.01)

(52) U.S. Cl.
CPC ............ *H01L 43/12* (2013.01); *B81C 1/00531* (2013.01); *B82Y 10/00* (2013.01); *B82Y 25/00* (2013.01); *G11B 5/3163* (2013.01); *H01L 21/3065* (2013.01); *H01L 27/228* (2013.01); *Y10T 428/24479* (2015.01)

(58) Field of Classification Search
None
See application file for complete search history.

(56) References Cited

U.S. PATENT DOCUMENTS

| | | | |
|---|---|---|---|
| 2004/0129361 A1* | 7/2004 | Chen et al. ................... | 156/58 |
| 2004/0222185 A1 | 11/2004 | Kawai | |
| 2008/0142156 A1 | 6/2008 | Djayaprawira et al. | |
| 2009/0159563 A1 | 6/2009 | Jung | |

FOREIGN PATENT DOCUMENTS

| | | |
|---|---|---|
| JP | 2004356179 A | 12/2004 |
| JP | 2005333106 A | 12/2005 |
| TW | 200910528 A | 3/2009 |

OTHER PUBLICATIONS

H. Xiao, "Introduction to Semiconductor Manufacturing Technology", published by Prentice Hall, 2001, ISBN 0-13-022404-9, pp. 329-335.*

Office Action corresponding to Taiwanese Application No. 101143849 mailed on Jan. 26, 2016.

* cited by examiner

*Primary Examiner* — Jiong-Ping Lu
(74) *Attorney, Agent, or Firm* — Harness, Dickey & Pierce

(57) ABSTRACT

Magnetic devices, and methods of manufacturing the same, include a stack structure including at least one magnetic layer, etched using an etching gas including at least 70 volume percent of a hydrogen-containing gas and at least 2 volume percent of CO gas.

18 Claims, 19 Drawing Sheets

MAGNETIC DEVICES AND METHODS OF MANUFACTURING THE SAME

CROSS-REFERENCE TO RELATED APPLICATIONS

This application claims the benefit of priority from Korean Patent Application No. 10-2011-0130476, filed on Dec. 7, 2011, in the Korean Intellectual Property Office, the disclosure of which is incorporated herein by reference in its entirety.

BACKGROUND

1. Field

Example embodiments relate to a magnetic device, and more particularly, to a method of manufacturing the same, and more particularly, to a magnetic device including a non-volatile magnetic layer, and a method of manufacturing the magnetic device.

2. Related Art

Research on electronic devices using magnetic resistive characteristics of a magnetic tunnel junction (MTJ) has been conducted. In particular, as an MTJ cell of a highly-integrated magnetic random access memory (MRAM) device is miniaturized, a spin transfer torque (STT)-MRAM that stores information by using a physical phenomenon called STT by applying a current directly to the MTJ cell and inducing magnetization inversion has drawn attention. An MTJ structure with a minute size needs to be formed to implement a highly-integrated STT-MRAM. An etching technology, which may readily realize a reliable MTJ cell for a MTJ structure with a minute size, needs to be developed.

SUMMARY

Example embodiments relate to a magnetic device, and more particularly, to a method of manufacturing the same, and more particularly, to a magnetic device including a non-volatile magnetic layer, and a method of manufacturing the magnetic device.

Example embodiment provides a method of manufacturing a magnetic device, the method including an etching process that may be readily performed to manufacture a highly-integrated high-density magnetic device.

Example embodiments also provide a magnetic device including a magnetic pattern having a fine width that is appropriate to a highly-integrated high-density magnetic device.

According to example embodiments, there is provided a method of manufacturing a magnetic device, the method including etching a stack structure including at least one magnetic layer by using an etching gas including at least 70 volume percent of a hydrogen-containing gas and at least 2 volume percent CO gas.

The hydrogen-containing gas may include at least one selected from $CH_4$ gas, $H_2$ gas and a combination thereof. In some example embodiments, the hydrogen-containing gas is $CH_4$ gas, and the etching gas may include about 70 to about 98 volume percent of the $CH_4$ gas and about 2 to about 30 volume percent of the CO gas. In some example embodiments, the hydrogen-containing gas is $H_2$ gas, and the etching gas may include about 70 to about 98 volume percent of the $H_2$ gas and 2 to 30 volume percent CO of the gas.

The etching gas may further include an additional gas including at least one selected from He, Ne, Ar, Kr, Xe and combinations thereof.

The etching of the stack structure may be performed at a temperature of about −10° C. to about 20° C.

Halogen elements may be excluded from the etching gas.

The stack structure may include at least one selected from Co/Pd, Co/Pt, Co/Ni, Fe/Pd, Fe/Pt, MgO, PtMn, IrMn, a CoFe alloy, a CoFeB alloy and combinations thereof.

The etching of the stack structure may include plasma etching using a plasma etching apparatus including a source power output unit configured for applying a source power and a bias power output unit configured for applying a bias power. In some example embodiments, the etching of the stack structure may include alternating at least one power of the source power and the bias power between an on state and an off state. In some example embodiments, the etching of the stack structure may include applying the source power in a constant mode and the bias power in a pulsed mode alternating between an on state and an off state.

The method may further include exposing a region to be etched of the stack structure to a hydrogen plasma prior to the etching of the stack structure.

The stack structure may include a lower magnetic layer, a tunneling barrier layer, and an upper magnetic layer, which are sequentially stacked, and the etching of the stack structure may include plasma etching the lower magnetic layer, the tunneling barrier layer, and the upper magnetic layer, respectively, using the etching gas to form a magnetic resistive device.

The method may further include forming a mask pattern on the stack structure, wherein the etching of the stack structure includes using the mask pattern as an etching mask.

The method may further include exposing an exposed surface of the magnetic resistive device to an oxygen plasma, after the etching of the stack structure.

According to example embodiments, there is provided a method of manufacturing a magnetic device, including forming a stack structure including at least one magnetic layer, and etching the at least one magnetic layer by exposing the at least one magnetic layer to an etching gas including at least 70 volume percent of a hydrogen-containing gas and at least 2 volume percent of CO gas.

The at least one magnetic layer may include at least one selected from Pt, Pd, Ni, Mn, Co, Mg, Fe, Ir and combinations thereof.

The removing of the portion of the at least one magnetic layer may form a plurality of magnetic resistive devices each having a width of about 20 nm or less.

The etching gas may include at least 80 volume percent of the hydrogen-containing gas and at least 10 volume percent of the CO gas.

The at least one magnetic layer may include a perpendicular magnetic anisotropy material.

According to example embodiments, there is provided a magnetic device including at least one magnetic resistive device having sidewalls formed by a plasma etching process using an etching gas including at least 70 volume percent of a hydrogen-containing gas and at least 2 volume percent of CO gas, wherein at least a portion of the sidewalls has a width not greater than about 20 nm.

BRIEF DESCRIPTION OF THE DRAWINGS

Example embodiments will be more clearly understood from the following detailed description taken in conjunction with the accompanying drawings in which.

DETAILED DESCRIPTION OF EXAMPLE EMBODIMENTS

Figure 1:
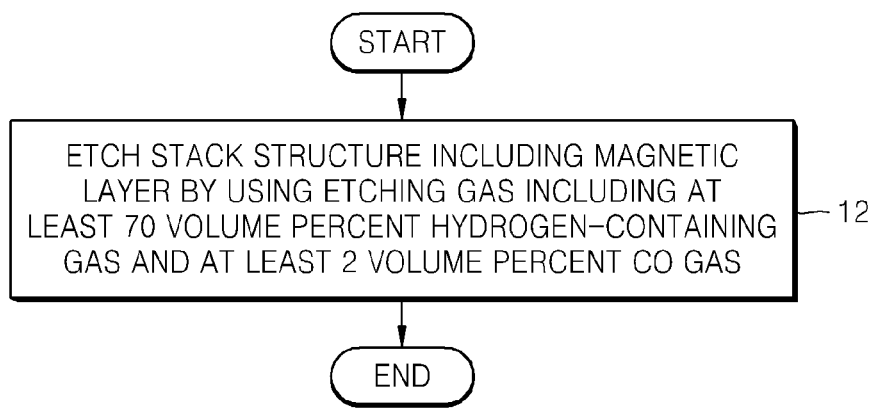
FIG. 1 is a flowchart illustrating a method of manufacturing a magnetic device, according to example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to a magnetic device, and more particularly, to a method of manufacturing the same, and more particularly, to a magnetic device including a nonvolatile magnetic layer, and a method of manufacturing the magnetic device.

FIG. 1 is a flowchart illustrating a method of manufacturing a magnetic device, according to example embodiments.

In operation 12 of FIG. 1, a stack structure including a magnetic layer is etched using an etching gas including at least 70 volume percent of a hydrogen-containing gas and at least 2 volume percent of CO gas (based on a total volume percent of the etching gas).

In some example embodiments, etching of the stack structure is performed by a plasma etching process. The etching process of operation 12 may be performed using a plasma etching apparatus including a source power output unit configured for applying a source power, and a bias power output unit configured for applying a bias power. A plasma etching apparatus 60 illustrated in FIG. 6, for example, may be used as the plasma etching apparatus. In the etching process of operation 12, in order to output at least one of the source power and the bias power in a pulsed mode, a power applied in the pulsed mode may be maintained in an off state according to a given period. The source power in the pulsed mode and the bias power in the pulsed mode will be described below with reference to FIGS. 6 and 7A through 7E in more detail. In operation 12, the etching process of the stack structure may be performed at a temperature of about −10° C. to about 80° C. In some example embodiments, the etching process of operation 12 may be performed at a temperature of about −10° C. to 20° C. In some example embodiments, the etching process of operation 12 may be performed under pressure of about 2 mT to about 5 mT.

The etching gas does not include a halogen-containing gas. In a plasma etching process using the halogen element-containing etching gas that is used in an existing magnetic layer etching process, non-volatile etching by-products are re-deposited on sidewalls of a pattern formed as an etching resultant structure. In addition, halogen element-containing etching residuals that deteriorate magnetization characteristics of a magnetic layer remain on the surface of the pattern formed as the etching resultant structure and thus characteristics of a magnetic resistive device are deteriorated. In particular, one important issue in a dry etching process for forming a magnetic resistive device is etching of a magnetic tunnel junction (MTJ) structure, which plays a crucial role in driving the magnetic resistive device. The MTJ structure includes a free layer, a tunneling barrier layer, and a fixing layer. The MTJ structure includes a ferromagnetic material (e.g., CoFeB), or the like, and magnesium oxide (MgO) is mainly used in forming the tunneling barrier layer. These materials result in severe damage to the tunneling barrier layer during plasma etching using the halogen element-containing gas, in particular, during chlorine (Cl)-based plasma etching, and corrosion in the MTJ structure. In a method of manufacturing a magnetic device according to example embodiments, a stack structure including a magnetic layer is etched using an etching gas that includes at least 70 volume percent of the hydrogen-containing gas and at least 2 volume percent of the CO gas and not including a halogen element, thereby solving the problems in existing processes.

The hydrogen-containing gas may be one selected from $CH_4$ gas, $H_2$ gas and a combination thereof. In some example embodiments, the etching gas includes 70 to 98 volume percent of the $CH_4$ gas and 2 to 30 volume percent of the CO gas. In some example embodiments, the etching gas includes 70 to 98 volume percent of the $H_2$ gas and 2 to 30 volume percent of the CO gas. In some example embodiments, the etching gas further includes an additional gas that includes at least one selected from He, Ne, Ar, Kr, Xe and combinations thereof. At least 10 volume percent of the additional gas may be included in the etching gas.

Figure 2A:
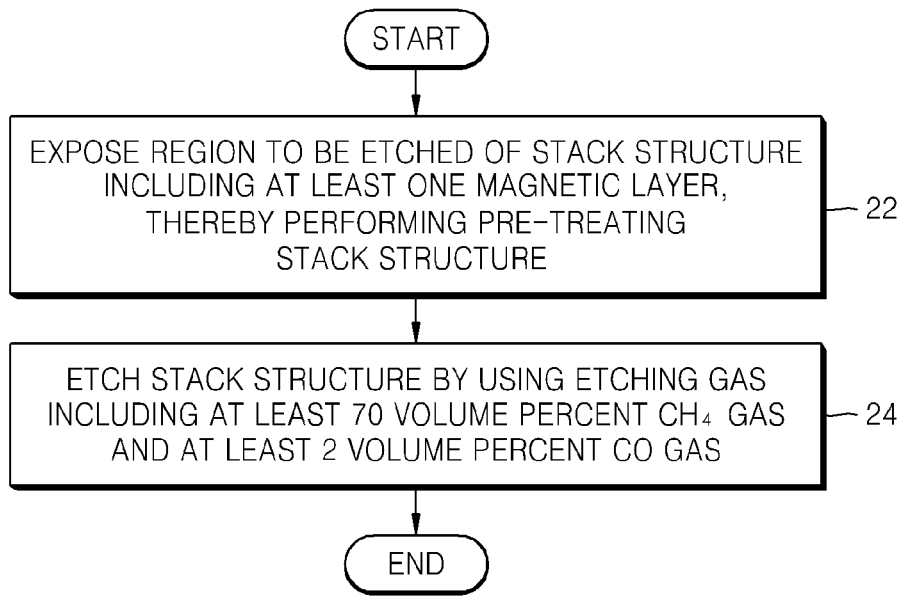
FIG. 2A is a flowchart illustrating a method of manufacturing a magnetic device, according to example embodiments.

FIG. 2A is a flowchart illustrating a method of manufacturing a magnetic device, according to example embodiments.

In operation 22 of FIG. 2A, a region to be etched of a stack structure including at least one magnetic layer is exposed to a hydrogen plasma, thereby performing pre-treatment on the stack structure.

In some example embodiments, in order to perform the pre-treatment process in operation 22, the stack structure is loaded into a chamber for plasma etching and only $H_2$ gas is supplied to the chamber, thereby generating the hydrogen plasma. Accelerated reactive hydrogen ions may be supplied to the region to be etched of the stack structure due to the pre-treatment process, and a chemical reaction between the region to be etched and the hydrogen ions may occur on the surface of the region to be etched. As a result, when etching gas ions collide with the region to be etched, subsequent chemical and physical etching processes may be easily performed and an etching rate may be accelerated.

In some example embodiments, the pre-treatment process of operation 22 is performed for about 10 seconds to about 10 minutes. The pre-treatment process of operation 22 may be performed at a temperature of about −10° C. to about 80° C. under pressure of about 2 mT to about 5 mT. If necessary, the pre-treatment process of operation 22 may be omitted.

In operation 24, the region to be etched of the stack structure including the magnetic layer is etched using an etching gas including at least 70 volume percent of the $CH_4$ gas and at least 2 volume percent of the CO gas.

In some example embodiments, in order to etch the stack structure, an etching gas including about 70 to 98 volume percent of the $CH_4$ gas and about 2 to 30 volume percent of the CO gas is used. In some example embodiments, the etching gas further includes an additional gas that includes at least one selected from He, Ne, Ar, Kr, Xe and combinations thereof. At least 10 volume percent of the additional gas may be included in the etching gas.

The etching process of operation 24 may be performed subsequent to the pre-treatment process of operation 22 in the same chamber. The etching process of operation 24 may be performed at a temperature of about −10° C. to about 80° C. under pressure of about 2 mT to about 5 mT.

When the etching process of operation 24 is performed, accelerated reactive hydrogen ions along with the accelerated ions of the additional gas may be supplied to the region to be etched of the stack structure. In the region to be etched, physical etching due to the accelerated ions generated from the additional gas may be performed simultaneously with a chemical reaction with the accelerated hydrogen ions that reach the surface of the region to be etched. The additional gas includes atoms having a larger atomic weight than that of hydrogen atoms. Thus, the accelerated ions generated from the additional gas collide stronger with the stack structure to be etched, than the hydrogen atoms. As a result, a relatively large physical force is applied to the region to be etched of the stack structure so that physical etching of the stack structure may be easily performed.

Figure 2B:
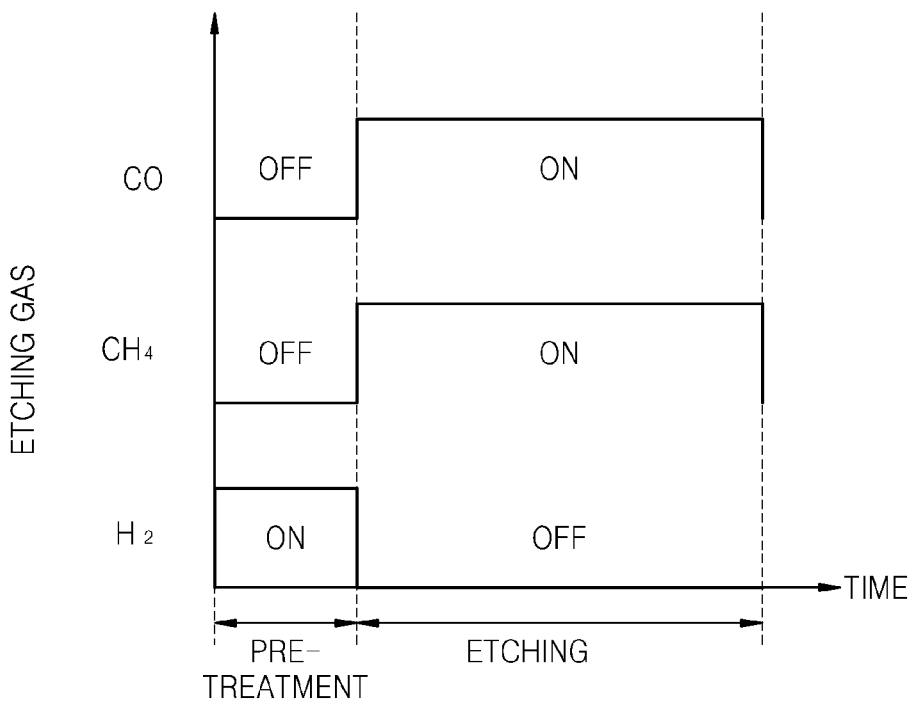
FIG. 2B is a gas supply pulse graph illustrating an example of a gas supply operation in a pre-treatment process and an etching process of the methods of manufacturing a magnetic device, according to example embodiments.

FIG. 2B is a gas supply pulse graph illustrating a gas supply operation in the pre-treatment process of operation 22 illustrated in FIG. 2A and the etching process of operation 24 illustrated in FIG. 2A.

Figure 3A:
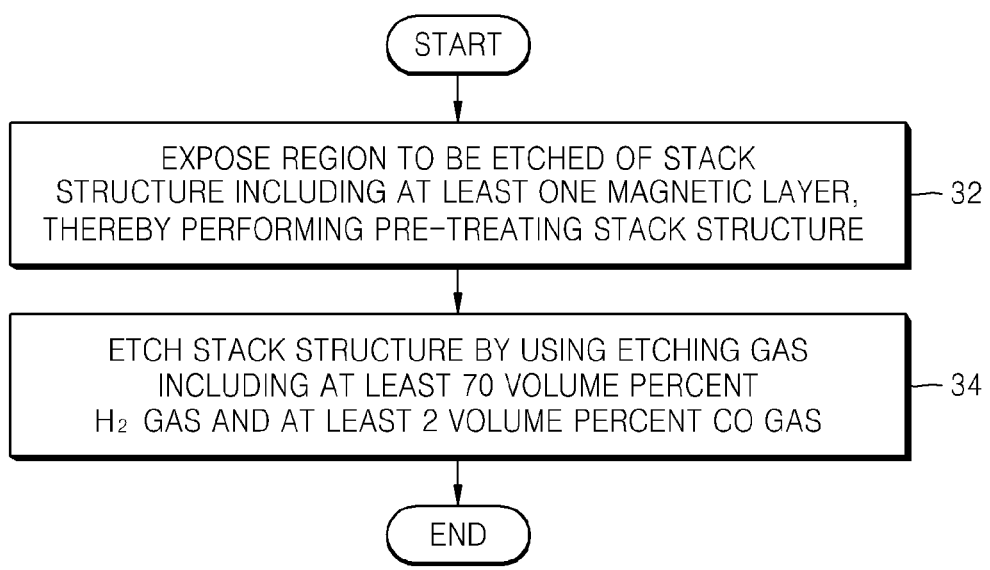
FIG. 3A is a flowchart illustrating a method of manufacturing a magnetic device, according to example embodiments.

FIG. 3A is a flowchart illustrating a method of manufacturing a magnetic device, according to example embodiments.

In operation 32 of FIG. 3A, a region to be etched of a stack structure including at least one magnetic layer is exposed to the hydrogen plasma, thereby pre-treating the stack structure.

The pre-treatment process of operation 32 is the same as described in the pre-treatment of operation 22 of FIG. 2A.

In operation 34, the region to be etched of the stack structure including the magnetic layer is etched using an etching gas including at least 70 volume percent of the $H_2$ gas and at least 2 volume percent of the CO gas.

In some example embodiments, in order to etch the stack structure, an etching gas including about 70 to 98 volume percent of the $H_2$ gas and about 2 to 30 volume percent of the CO gas is used. In some example embodiments, the etching gas further includes an additional gas that includes at least one selected from He, Ne, Ar, Kr, Xe and combinations thereof. At least 10 volume percent of the additional gas may be included in the etching gas.

The etching process of operation 34 may be performed in the same chamber subsequent to the pre-treatment process of operation 32. The etching process of operation 34 may be performed at a temperature of about −10° C. to about 80° C. under pressure of about 2 mT to about 5 mT.

When the etching process is performed in operation 34, like in operation 24 of FIG. 2A, accelerated reactive hydrogen ions and accelerated ions of the additional gas may be together supplied to the region to be etched of the stack structure. Thus, a relatively large physical force is applied to the region to be etched of the stack structure due to the accelerated ions generated from the additional gas.

Figure 3B:
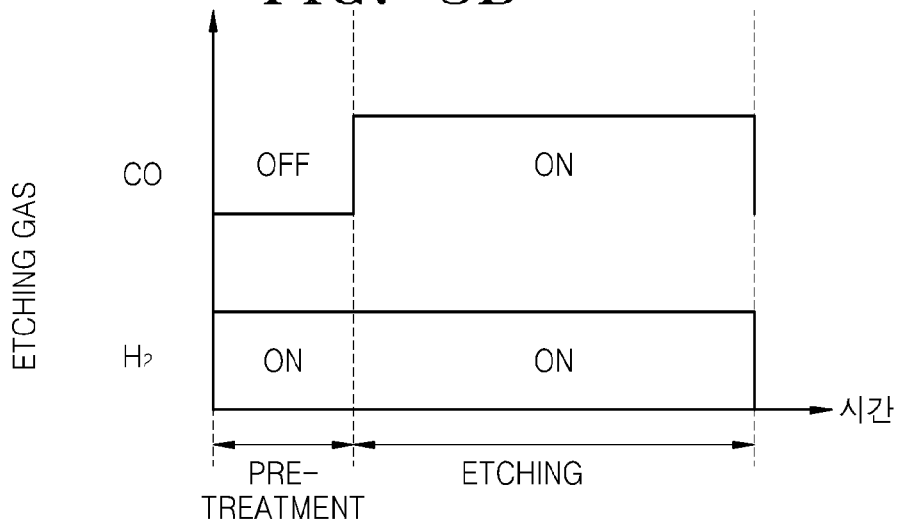
FIG. 3B is a gas supply pulse graph illustrating another example of a gas supply operation in a pre-treatment process and an etching process of the methods of manufacturing a magnetic device, according to example embodiments.

FIG. 3B is a gas supply pulse graph illustrating a gas supply operation in the pre-treatment process of operation 32 of FIG. 3A and the etching process of operation 34 of FIG. 3A.

In the etching process of operation 12 of FIG. 1, the etching process of operation 24 of FIG. 2A, and the etching process of operation 34 of FIG. 3A, the stack structure that has a layer to be etched may include various types of magnetic layers. In some example embodiments, the stack structure includes at least one non-volatile magnetic layer. For example, the stack structure may include a magnetic layer formed of at least one material selected from Co/Pd, Co/Pt, Co/Ni, Fe/Pd, Fe/Pt, MgO, PtMn, IrMn, a CoFe alloy, a CoFeB alloy and combinations thereof.

The etching process of operation 12 of FIG. 1, the etching process of operation 24 of FIG. 2A, and the etching process of operation 34 of FIG. 3A, may be performed using plasma that is generated from an inductively coupled plasma (ICP) source, a capacitively coupled plasma (CCP) source, an (electron cyclotron resonance (ECR) plasma source, a helicon-wave excited plasma (HWEP) source, or an adaptively coupled plasma (ACP) source.

Figure 4:
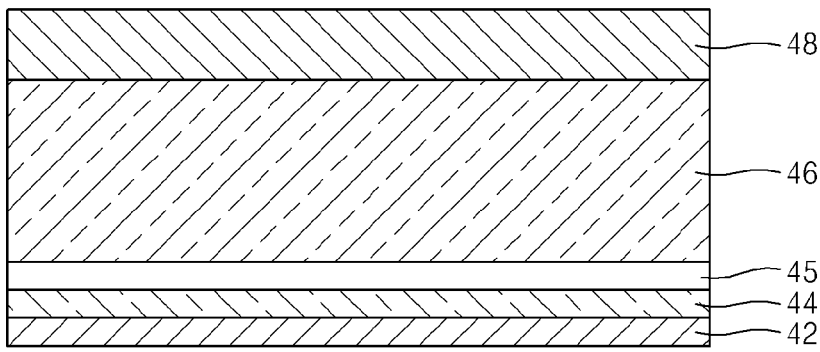
FIG. 4 is a cross-sectional view of a stack structure that may be etched using a method of manufacturing a magnetic device, according to example embodiments.
Figure 5:
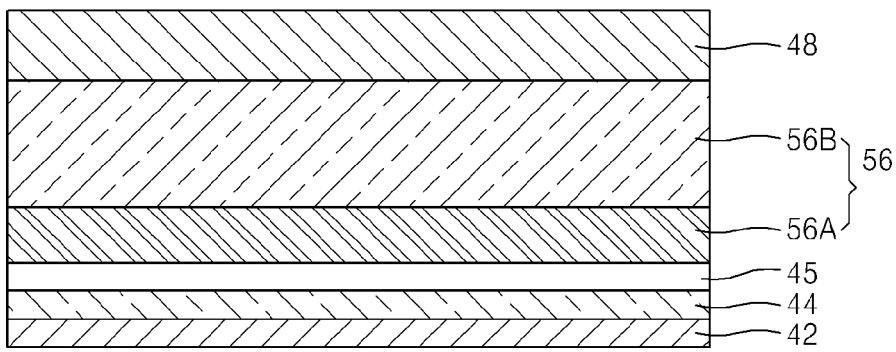
FIG. 5 is a cross-sectional view of a stack structure that may be etched using a method of manufacturing a magnetic device, according to example embodiments.

FIG. 4 is a cross-sectional view of a stack structure that may be etched using a method of manufacturing a magnetic device, according to example embodiments. FIG. 5 is a cross-sectional view of a stack structure that may be etched using a method of manufacturing a magnetic device, according to example embodiments.

Referring to FIGS. 4 and 5, stack structures 40 and 50 that may be etched using an etching gas including at least 70 volume percent of the hydrogen-containing gas and at least 2 volume percent of the CO gas by performing the method of manufacturing a magnetic device, according to example embodiments.

In FIGS. 4 and 5, like reference numerals refer to like elements. For clarity, a repeated description thereof is omitted.

In more detail, the stack structure 40 illustrated in FIG. 4 includes a lower electrode layer 42, a lower magnetic layer 44, a tunneling barrier layer 45, an upper magnetic layer 46, and an upper electrode layer 48, which are sequentially stacked from bottom to top.

The lower electrode layer 42 may include at least one material selected from Ti, Ta, Ru, TiN, TaN, W and combinations thereof. In some example embodiments, the lower electrode layer 42 may have a bi-layer structure selected from Ti\Ru, Ta\Ru, TiN\Ru, TaN\Ru, or TiN\Ru. In some example embodiments, the lower electrode layer 42 may have a thickness of about 20 Å to 50 Å.

The lower magnetic layer 44 may include at least one selected from Fe, Co, Ni, Pd, Pt and combinations thereof. In some example embodiments, the lower magnetic layer 44 is formed of a Co-M1 alloy (where M1 is at least one metal selected from Pt, Pd, Ni and combinations thereof) or a Fe-M2 alloy (where M2 is at least one metal selected from Pt, Pd, Ni and combinations thereof). In some example embodiments, the lower magnetic layer 44 further includes at least one material selected from B, C, Cu, Ag, Au, Cr and combinations thereof. In some example embodiments, the lower magnetic layer 44 has a thickness of about 10 Å to 50 Å.

The upper magnetic layer 46 may include at least one selected from Co, a Co-M1 alloy (where M1 is at least one metal selected from Pt, Pd, Ni and combinations thereof), a Fe-M2 alloy (where M2 is at least one metal selected from Pt, Pd, Ni and a combination thereof), Ru, Ta, Cr, Cu and combinations thereof. In some example embodiments, the upper magnetic layer 46 has a thickness of about 30 Å to 200 Å.

In some example embodiments, at least one of the lower magnetic layer 44 and the upper magnetic layer 46 includes a perpendicular magnetic anisotropy (PMA) material. In some example embodiments, at least one of the lower magnetic layer 44 and the upper magnetic layer 46 includes a synthetic antiferromagnet (SAF) structure. The SAF structure is a formed by inserting a Ru intermediate layer in a ferromagnetic stack structure. For example, the SAF structure may have a multi-layer structure of CoFeB/Ta/(Co/Pt)$_m$/Ru/(Co/Pd)$_n$ (where m and n are natural numbers). The SAF structure that may be employed in example embodiments is not limited thereto, and various modified structures may be used.

The tunneling barrier layer 45 that is interposed between the lower magnetic layer 44 and the upper magnetic layer 46 may be formed of MgO, $Al_2O_3$, $B_2O_3$, $SiO_2$ or combinations thereof. In some example embodiments, the tunneling barrier layer 45 has a thickness of about 5 Å to 30 Å.

The upper electrode layer 48 may include at least one material selected from Ti, Ta, Ru, TiN, TaN, W and combinations thereof. In some example embodiments, the upper electrode layer 48 may have a bi-layer structure selected from Ti\Ru, Ta\Ru, TiN\Ru, TaN\Ru, or TiN\Ru. In some example embodiments, the upper electrode layer 48 may have a thickness of about 20 Å to 50 Å.

The lower magnetic layer 44 and the upper magnetic layer 46 of the stack structure 40 are not limited to the above description and may be modified variously. For example, the description of the lower magnetic layer 44 may apply to the upper magnetic layer 46, and vice versa.

In some example embodiments, the stack structure 40 may be used in implementing an MTJ device using perpendicular magnetization.

The stack structure 50 illustrated in FIG. 5 includes a lower electrode layer 42, a lower magnetic layer 44, a tunneling barrier layer 45, an upper magnetic layer 56, and an upper electrode layer 48, which are sequentially stacked from bottom to top.

The upper magnetic layer 56 includes a pinned layer 56A and a pinning layer 56B, which are sequentially stacked on the tunneling barrier layer 45.

The pinned layer 56A may include at least one ferromagnetic material selected from Co, Fe, Pt, Pd and combinations thereof. The pinned layer 56A may have the SAF structure illustrated in FIG. 4. In some example embodiments, the pinned layer 56A has a thickness of about 30 Å to 50 Å.

The pinning layer 56B may include an antiferromagnetic material. In some example embodiments, the pinning layer 56B may include at least one selected from PtMn, IrMn, NiMn, FeMn, MnO, MnS, MnTe, $MnF_2$, $FeCl_2$, FeO, $CoCl_2$, CoO, $NiCl_2$, NiO, Ni or combinations thereof. In some example embodiments, the pinning layer 56B has a thickness of about 50 Å to 150 Å.

In some example embodiments, the stack structure 50 may be used in implementing an MTJ device using horizontal magnetization.

Figure 6:
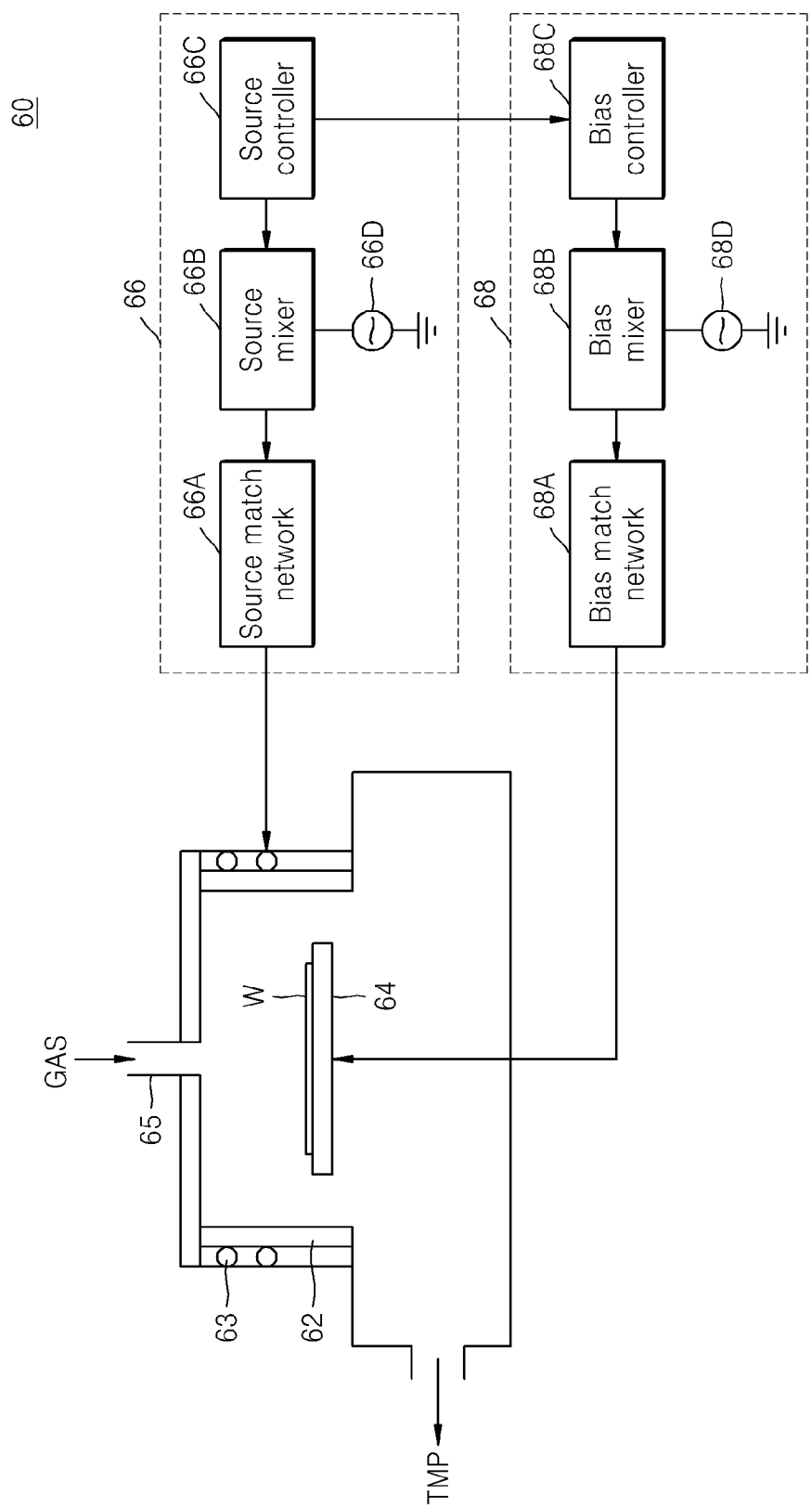
FIG. 6 illustrates main elements of a plasma etching apparatus that may be used for performing a plasma etching process of a method of manufacturing a magnetic device, according to example embodiments.

FIG. 6 illustrates main elements of the plasma etching apparatus that may be used in performing a plasma etching process of a method of manufacturing a magnetic device, according to example embodiments.

Referring to FIG. 6, a plasma etching apparatus 60 includes a chamber 62, a source electrode 63, and a bias electrode 64. The bias electrode 64 is configured as a holder for supporting a substrate W. The source electrode 63 may have a coil shape in which the chamber 62 is wound a plurality of times.

A radio frequency (RF) source power may be applied to the source electrode 63, and an RF bias power may be applied to the bias electrode 64. An etching gas used in plasma etching flows into the chamber 62 via a gas inlet 65. An unreacted etching gas and reaction by-products that remain after etching are discharged from the chamber 62 by using a turbo molecular pump (TMP).

In a plasma etching apparatus using a CCP method, a flat type electrode that is disposed in the chamber 62 close to the gas inlet 65, instead of the source electrode 63 may be used.

The plasma etching apparatus 60 includes a source power output unit 66 and a bias power output unit 68. The source power output unit 66 and the bias power output unit 68 may output a source power and a bias power in a mode appropriate for performing a synchronous pulse plasma etching process, respectively.

The source power output unit 66 includes a source match network 66A, a source mixer 66B, a source controller 66C, and a source RF generator 66D. The bias power output unit 68 includes a bias match network 68A, a bias mixer 68B, a bias controller 68C, and a bias RF generator 68D.

The source power output from the source power output unit 66 is applied to the source electrode 63. The source electrode 63 is configured for generating plasma in the chamber 62. The bias power output from the bias power output unit 68 is applied to the bias electrode 64. The bias electrode 64 is configured for controlling ion energy that enters the substrate W.

The source controller 66C of the source power output unit 66 may output a pulse-modulated RF source power having a first frequency and a first duty cycle, and may output a control signal including information regarding a phase of the RF source power to the RF bias power output unit 68. The source mixer 66B receives a source RF signal output from the source RF generator 66D and a source pulse signal output from the source controller 66C, and mixes them, thereby outputting a pulse-modulated RF source power.

The bias power output unit 68 outputs an RF bias power having a second frequency and a second duty cycle to the bias electrode 64 in response to the control signal output from the source power output unit 66.

In some example embodiments, the RF bias power is applied to the bias electrode 64 from the bias power output unit 68 so that ions of plasma formed on the substrate W inside the chamber 62 have directivity.

A heater (not shown) configured for heating the substrate W supported on the bias electrode 64 and a temperature sensor (not shown) configured for controlling the internal temperature of the chamber 62 may be additionally disposed on the bottom of the bias electrode 64, or inside the bias electrode 64.

In some example embodiments, the source power output unit 66 and the bias power output unit 68 may be controlled to respectively output power in a constant wave mode or output power in a pulsed mode selectively, if necessary. To this end, the source power output unit 66 and the bias power output unit 68 may operate to control interactive conversion of an on state and an off state of power output, respectively. For example, the on state and the off state of each of the source power output unit 66 and the bias power output unit 68 may be controlled so that a source power in the pulsed mode and a bias power in the pulsed mode may be output from the source power output unit 66 and the bias power output unit 68, respectively.

Figure 7A:
FIG. 7A is a graph showing a source power output in a constant wave mode in the plasma etching apparatus illustrated in FIG. 6 versus time.

FIG. 7A is a graph showing a source power output in a constant wave mode in the plasma etching apparatus of FIG. 6 versus time.

Figure 7B:
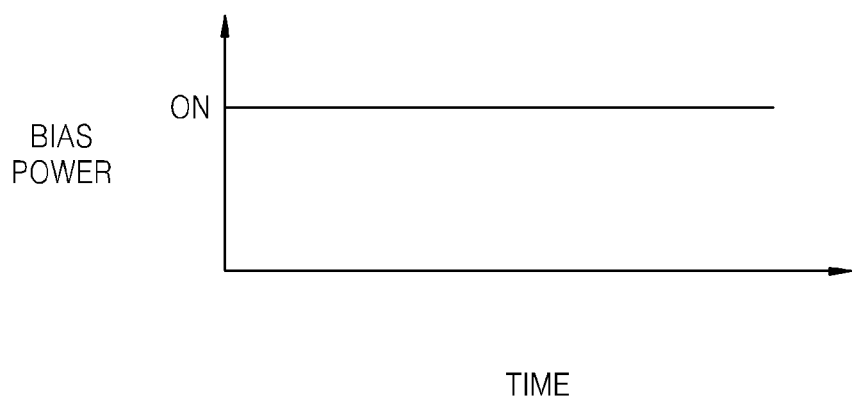
FIG. 7B is a graph showing a bias power output in a constant wave mode in the plasma etching apparatus illustrated in FIG. 6 versus time.

FIG. 7B is a graph showing a bias power output in the constant wave mode in the plasma etching apparatus of FIG. 6 versus time.

Figure 7C:
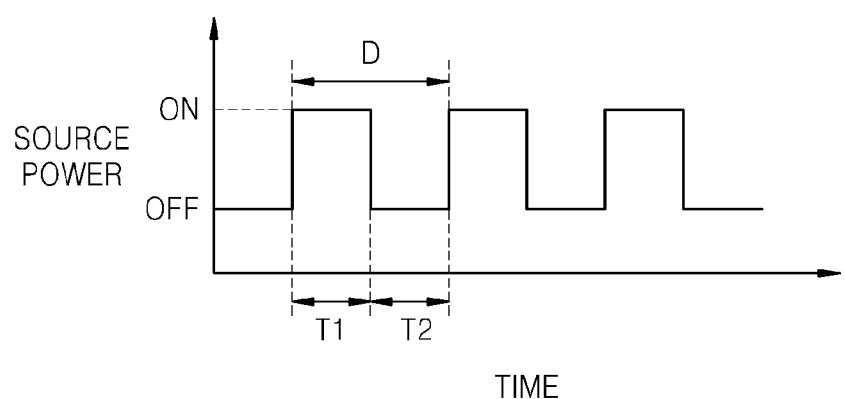
FIG. 7C is a graph showing a duty cycle of a source power output in a pulsed mode in the plasma etching apparatus illustrated in FIG. 6 versus a duty cycle time.

FIG. 7C is a graph showing a duty cycle D of a source power output in a pulsed mode in the plasma etching apparatus illustrated in FIG. 6 versus time.

Figure 7D:
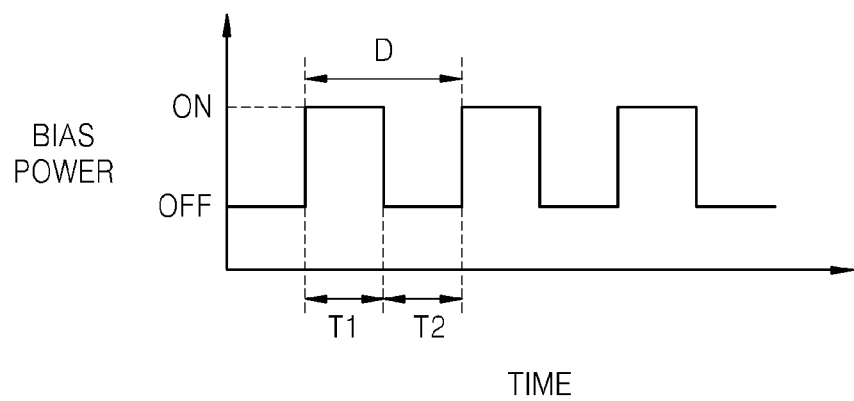
FIG. 7D is a graph showing a duty cycle of a bias power output in a pulsed mode in the plasma etching apparatus illustrated in FIG. 6 versus time.

FIG. 7D is a graph showing a duty cycle D of a bias power output in a pulsed mode in the plasma etching apparatus illustrated in FIG. 6 versus time.

In FIGS. 7C and 7D, an on state time T1 and an off state time T2 may be set in various ways. The on state time T1 and the off state time T2 may be the same or not. The on state time T1 and the off state time T2 may be arbitrarily selected according to quality and thickness of a layer to be etched, an etching atmosphere, or the like. In some example embodiments, the on state time T1 and the off state time T2 may be variably set as a process time elapses.

Figure 7E:
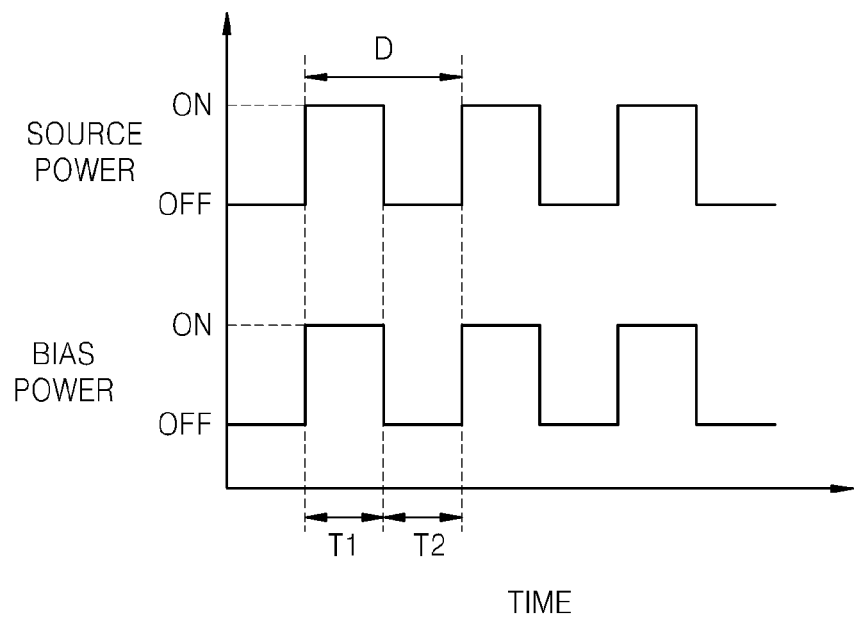
FIG. 7E is a graph showing a duty cycle of a source power and a bias power that are output in a pulsed mode so as to perform an etching process using a synchronous pulse plasma etching of the plasma etching apparatus illustrated in FIG. 6 versus time.

FIG. 7E is a graph showing a duty cycle D of a source power and a bias power that are output in a pulsed mode so as to perform an etching process by using a synchronous pulse plasma etching of the plasma etching apparatus illustrated in FIG. 6 versus time.

Figure 8A:
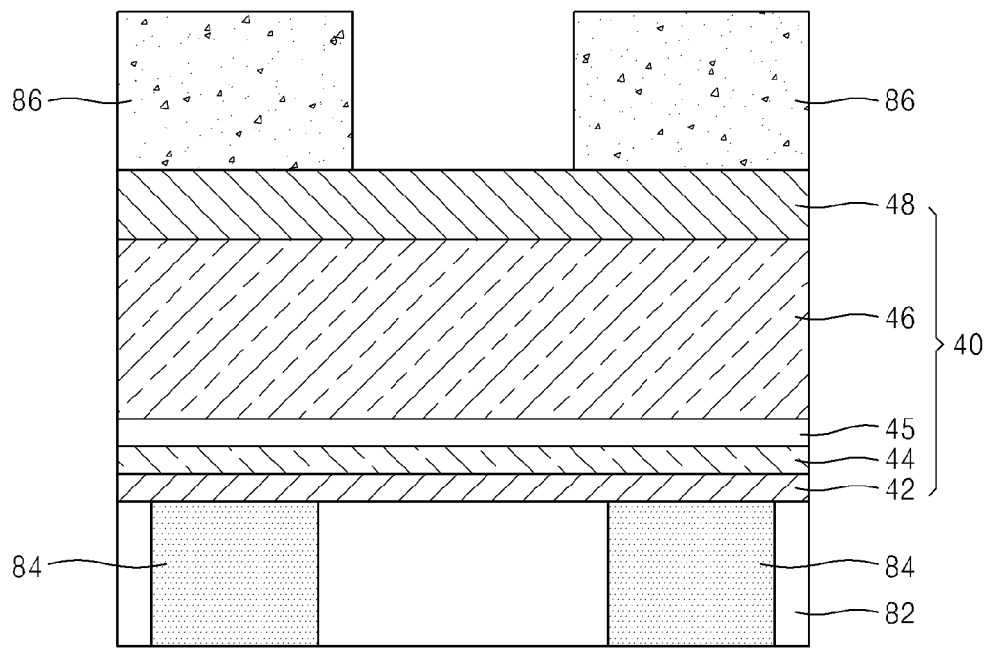
FIGS. 8A through 8C are cross-sectional views illustrating the order of processes of a method of manufacturing a magnetic device, according to example embodiments.
Figure 8B:
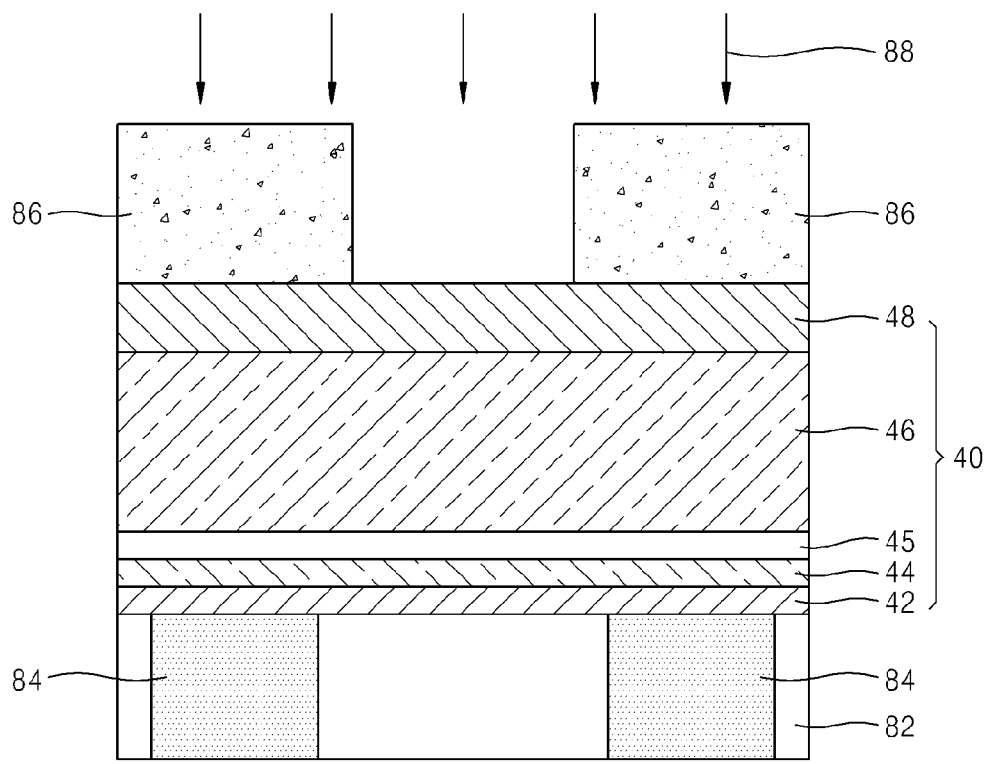
Figure 8C:
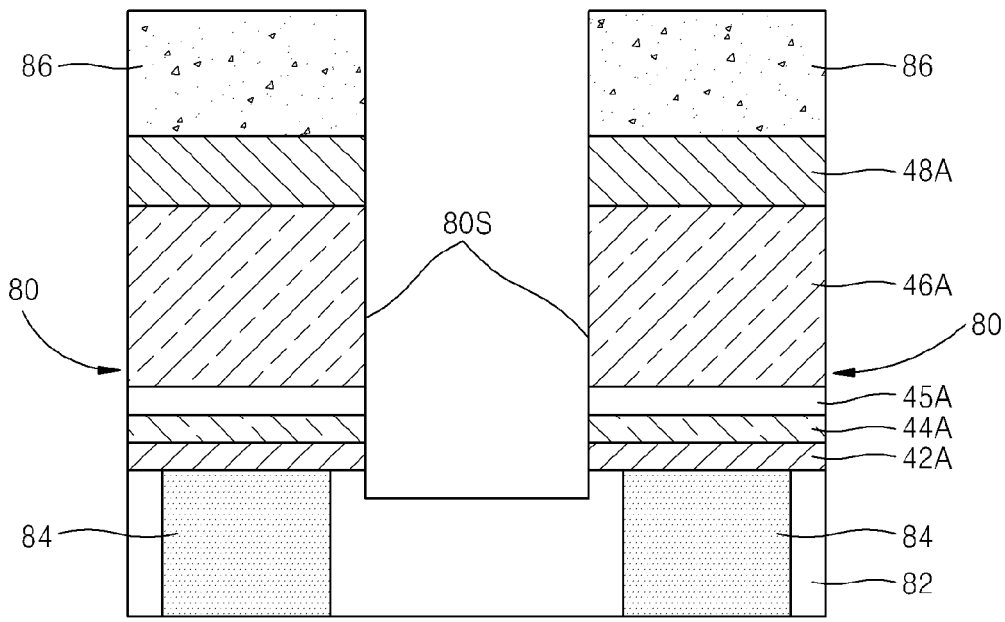

FIGS. 8A through 8C are cross-sectional views illustrating the order of processes of a method of manufacturing a magnetic device (see FIG. 8C), according to example embodiments.

In the current example embodiments, the method of manufacturing a magnetic device 80 including a process of etching the stack structure 40 of FIG. 4 will be described. In FIGS. 8A through 8C, like elements in FIG. 4 refer to like elements, and for clarity, a detailed description thereof is omitted.

Referring to FIG. 8A, after the stack structure 40 described with reference to FIG. 4 is formed on a resultant structure including an interlayer insulating layer 82 and a lower electrode contact 84 formed through the interlayer insulating layer 82, a mask pattern 86 for exposing a portion of a top surface of the upper electrode layer 48 is formed on the stack structure 40.

The mask pattern 86 is formed on the stack structure 40 on the same axis as the lower electrode contact 84. In some example embodiments, the mask pattern 86 may be include at least one material selected from Ru, W, TiN, TaN, Ti, Ta and combinations there. In some example embodiments, the mask pattern 86 has a bi-layer structure of Ru\TiN or TiN\W. The mask pattern 86 may have a thickness of about 300 Å to 800 Å.

Referring to FIG. 8B, a resultant structure, including the mask pattern 86, is loaded into a plasma etching chamber. For example, the resultant structure including the mask pattern 86 may be loaded onto the bias electrode 64 in the chamber 62 of the plasma etching apparatus 60 of FIG. 6.

Next, similar to operation 22 of FIG. 2A or operation 32 of FIG. 3A, the exposed region of the upper electrode layer 48 of the stack structure 40 is exposed to hydrogen plasma 88 in the chamber 62, thereby performing pre-treatment on the stack structure 40. The pre-treatment process using the hydrogen plasma 88 may be omitted if necessary.

Referring to FIG. 8C, similar to operation 24 of FIG. 2, the pre-treated stack structure 40 is anisotropically etched by using an etching gas including 70 volume percent hydrogen-containing gas and at least 2 volume percent CO gas and by using the mask pattern 86 as an etching mask.

In some example embodiments, in order to etch the stack structure 40, similar to operation 24 of FIG. 2A, an etching gas including at least 70 volume percent of the $CH_4$ gas and at least 2 volume percent of the CO gas is used. In some example embodiments, similar to operation 34 of FIG. 3A, an etching gas including at least 70 volume percent of the $H_2$ gas and at least 2 volume percent of the CO gas is used. In some example embodiments, the etching gas further includes an additional gas that includes at least one selected from He, Ne, Ar, Kr, Xe and combinations thereof. At least 10 volume percent of the additional gas may be included in the etching gas. For example, the etching gas may include 80 volume percent of the $CH_4$ gas and 20 volume percent of the CO gas. Alternatively, the etching gas may include 80 volume percent of the $CH_4$ gas, 10 volume percent of the CO gas, and 10 volume percent of an Ar gas. Alternatively, the etching gas may include 80 volume percent of the H gas and 20 volume percent of the CO gas. Alternatively, the etching gas may include 80 volume percent of the $H_2$ gas, 10 volume percent of the CO gas, and 10 volume percent of the Ar gas.

As an etching resultant structure of the stack structure 40, a plurality of magnetic devices 80, each including a lower electrode 42A, a lower magnetic layer pattern 44A, a tunneling barrier layer 45A, an upper magnetic layer pattern 46A, an upper electrode 48A, and the remaining mask pattern portion 86, which are sequentially stacked from bottom to top, are formed. In each of the plurality of magnetic devices 80, the remaining mask pattern portion 86 and the upper electrode 48A are configured as one electrode. Each of the plurality of magnetic devices 80 is electrically connected to the lower electrode contact 84. While the stack structure 40 is etched, a portion of the stack structure 40 may be consumed from a top surface of the mask pattern 86 by etching.

The etching process of the stack structure 40 may be performed in the same chamber as the chamber for performing the pre-treatment process of FIG. 8B subsequent to the pre-treatment process. The etching process of the stack structure 40 may be performed at a temperature of about −10° C. to 80° C. under pressure of about 2 mT to about 5 mT. For example, the etching process of the stack structure 40 may be performed at a temperature of about 20° C. under pressure of about 2 mT.

Figure 9A:
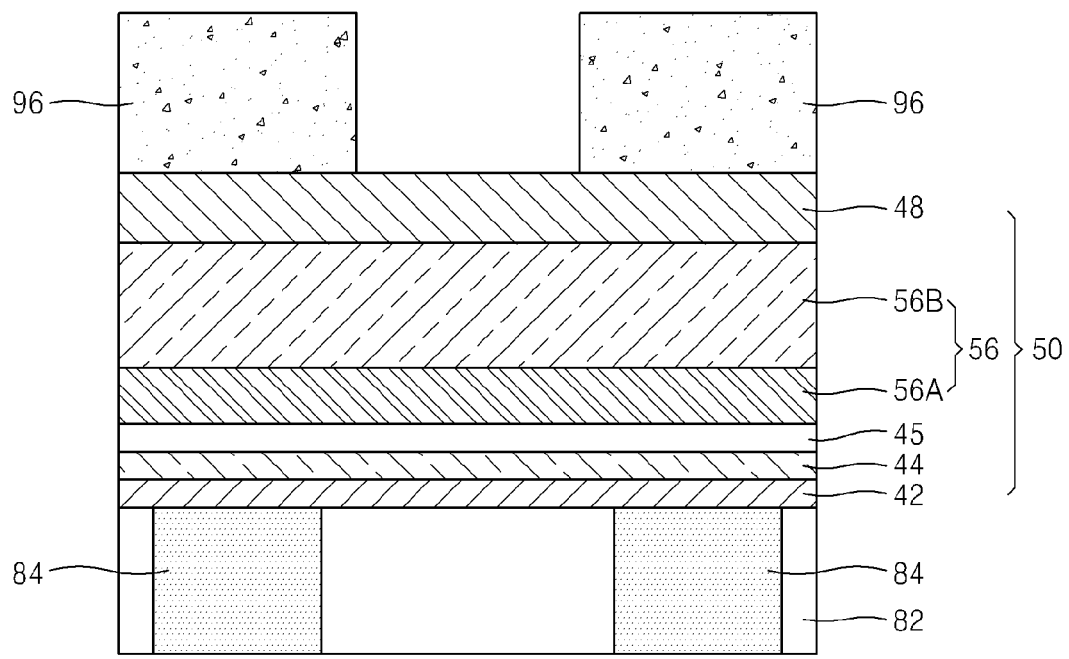
FIGS. 9A through 9C are cross-sectional views illustrating the order of processes of a method of manufacturing a magnetic device, according to example embodiments.
Figure 9B:
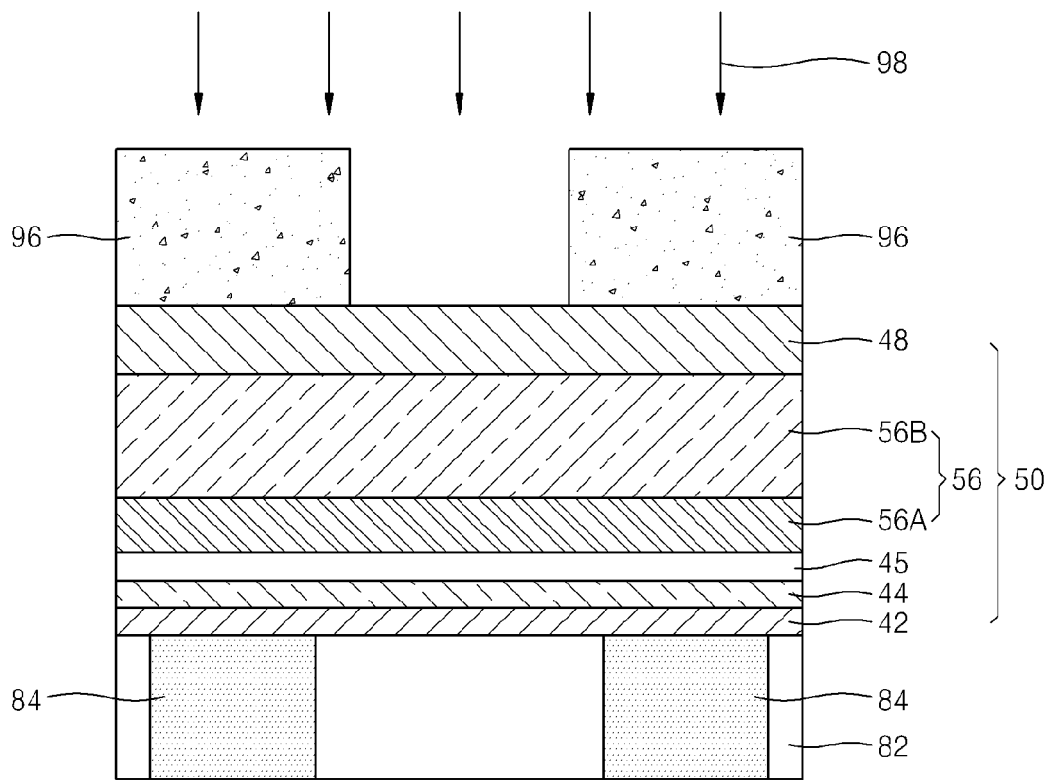
Figure 9C:
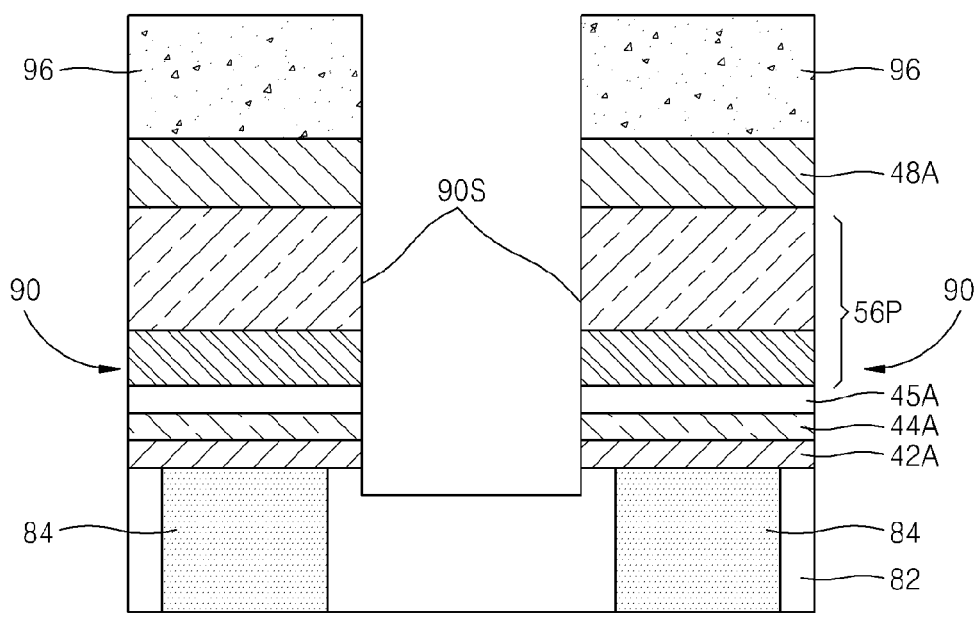

FIGS. 9A through 9C are cross-sectional views illustrating the order of processes of a method of manufacturing a magnetic device (see FIG. 9C), according to example embodiments.

In the current example embodiments, the method of manufacturing a magnetic device 90 including the process of etching the stack structure 50 of FIG. 5 will be described. In FIGS. 9A through 9C, like reference numerals in FIGS. 4, 5, and 8A through 8C refer to like elements, and for clarity, a detailed description thereof is omitted.

Referring to FIG. 9A, after the stack structure 50, as described with reference to FIG. 5 is formed on a resultant structure including an interlayer insulating layer 82 and a lower electrode contact 84, a mask pattern 96 for exposing a portion of a top surface of the upper electrode layer 48 is formed on the stack structure 50.

The mask pattern 96 is formed on the stack structure 50 on the same axis as that of the lower electrode contact 84. In some example embodiments, the mask pattern 96 may include at least one material selected from Ru, W, TiN, TaN, Ti, Ta and combinations thereof. In some example embodiments, the mask pattern 96 has a bi-layer structure of Ru\TiN or TiN\W. The mask pattern 96 may have a thickness of about 300 Å to 800 Å.

Referring to FIG. 9B, a resultant structure including the mask pattern 96 is loaded into a plasma etching chamber. For example, the resultant structure including the mask pattern 96 may be loaded onto the bias electrode 64 in the chamber 62 of the plasma etching apparatus 60 of FIG. 6.

Next, as described in operation 22 of FIG. 2A or operation 32 of FIG. 3A, the exposed region of the upper electrode layer 48 to be etched of the stack structure 50 in the chamber 62 is exposed to hydrogen plasma 98, thereby performing pre-treatment on the stack structure 50.

Referring to FIG. 9C, the stack structure 50 that is pre-treated in a plasma state of the etching gas is anisotropically etched by using the etching gas including 70 volume percent of the hydrogen-containing gas and at least 2 volume percent of the CO gas, and by using the mask pattern 96 as an etching mask.

In some example embodiments, in order to etch the stack structure 50, similar to operation 24 of FIG. 2A, an etching as including at least 70 volume percent of the $CH_4$ gas and at least 2 volume percent of the CO gas is used. In some example embodiments, similar to operation 34 of FIG. 3A, an etching gas including at least 70 volume percent of the $H_2$ gas and at least 2 volume percent of the CO gas is used. In some example embodiments, the etching gas further includes an additional gas that includes at least one selected from He, Ne, Ar, Kr, Xe and combinations thereof. At least 10 volume percent of the additional gas may be included in the etching gas. For example, the etching gas may include 80 volume percent of the $CH_4$ gas and 20 volume percent of the CO gas. Alternatively, the etching gas may include 80 volume percent of the $CH_4$ gas, 10 volume percent of the CO gas, and 10 volume percent of the Ar gas. Alternatively, the etching gas may include 80 volume percent of the $H_2$ gas and 20 volume percent of the CO gas. Alternatively, the etching gas may include 80 volume percent of the $H_2$ gas, 10 volume percent of the CO gas, and 10 volume percent of the Ar gas.

As an etching resultant structure of the stack structure 50, a plurality of magnetic devices 90 is formed. The plurality of magnetic devices 90 includes a lower electrode 42A, a lower magnetic layer pattern 44A, a tunneling barrier layer 45A, an upper magnetic layer pattern 56P, an upper electrode 48A, and the remaining mask pattern 96, which are sequentially stacked from bottom to top. In the plurality of magnetic devices 90, the remaining mask pattern 96 and the upper electrode 48A are configured as one electrode. Each of the plurality of magnetic devices 90 is electrically connected to the lower electrode contact 84. While the stack structure 50 is etched, a portion of the stack structure 50 may be consumed from a top surface of the mask pattern 96 by etching.

The etching process of the stack structure 50 may be performed in the same chamber as the chamber for performing the pre-treatment process of FIG. 9B subsequent to the pre-treatment process. The etching process of the stack structure 50 may be performed at a temperature of about −10° C. to 80° C. under pressure of about 2 mT to about 5 mT. For example, the etching process of the stack structure 50 may be performed at a temperature of about 20° C. under pressure of about 2 mT.

In the method of manufacturing the magnetic device 80 illustrated in FIGS. 8A through 8C and the method manufacturing the magnetic device 90 illustrated in FIGS. 9A through 9C, the plasma etching apparatus 60 of FIG. 6 may be used to perform the etching process of the stack structure 40 or 50. In the plasma etching apparatus 60, while the stack structure 40 or 50 is etched, a source power and a bias power may be output in a constant wave mode, as illustrated in FIGS. 7A and 7B, respectively. In some example embodiments, while the stack structure 40 or 50 is etched, the source power in the pulsed mode or the bias power in the pulsed mode in which the source or bias power alternates between an on state and an off state, as illustrated in FIG. 7C or 7D, may be output. In some example embodiments, when the stack structure 40 or 50 is etched, the source power in the pulsed mode and the bias power in the pulsed mode may be simultaneously applied in order to perform a synchronous pulse plasma etching process, as illustrated in FIG. 7E.

The stack structure 40 or 50 of FIG. 4 or 5 may include a non-volatile material (e.g., Pt, Pd, Co, Mg, Fe, Ir, or the like), which is not easily etched by a conventional etching process. Because saturation vapor pressure of reaction materials generated during an etching process is very low compared to other etching materials, these non-volatile materials have very low etching rates in existing etching process conditions, and reaction products during the etching process are re-deposited on sidewalls of a pattern formed after etching. When etching by-products are re-deposited on the sidewalls of the pattern in this way, a vertical sidewall profile of the final pattern formed as a result of etching is severely sloped and it is difficult to control a critical dimension (CD). In addition, non-volatile metal reaction by-products are re-deposited on the sidewalls of the pattern so that an electrical short between a lower electrode and an upper electrode occurs and MTJ characteristics are deteriorated.

On the other hand, in the method of manufacturing a magnetic device, according to example embodiments, when the stack structure 40 or 50 including a non-volatile magnetic layer is etched, the stack structure 40 or 50 is etched using the etching gas including at least 70 volume percent of the hydrogen-containing gas and at least 2 volume percent of the CO gas. In this regard, the stack structure 40 or 50 is etched in a single step from the upper electrode layer 48 to the lower electrode layer 42 and is separated into the plurality of magnetic devices 80 or 90. As a result of etching the stack structure 40 or 50 by using the etching gas including at least 70 volume percent of the hydrogen-containing gas and at least 2 volume percent of the CO gas (based on a total volume percent of the etching gas), the etching by-products may be prevented from being re-deposited on each etched surface (i.e., sidewalls 80S of the plurality of magnetic devices 80 or sidewalls 90S of the plurality of magnetic devices 90), and a magnetic device may have a vertical sidewall profile.

Figure 10A:
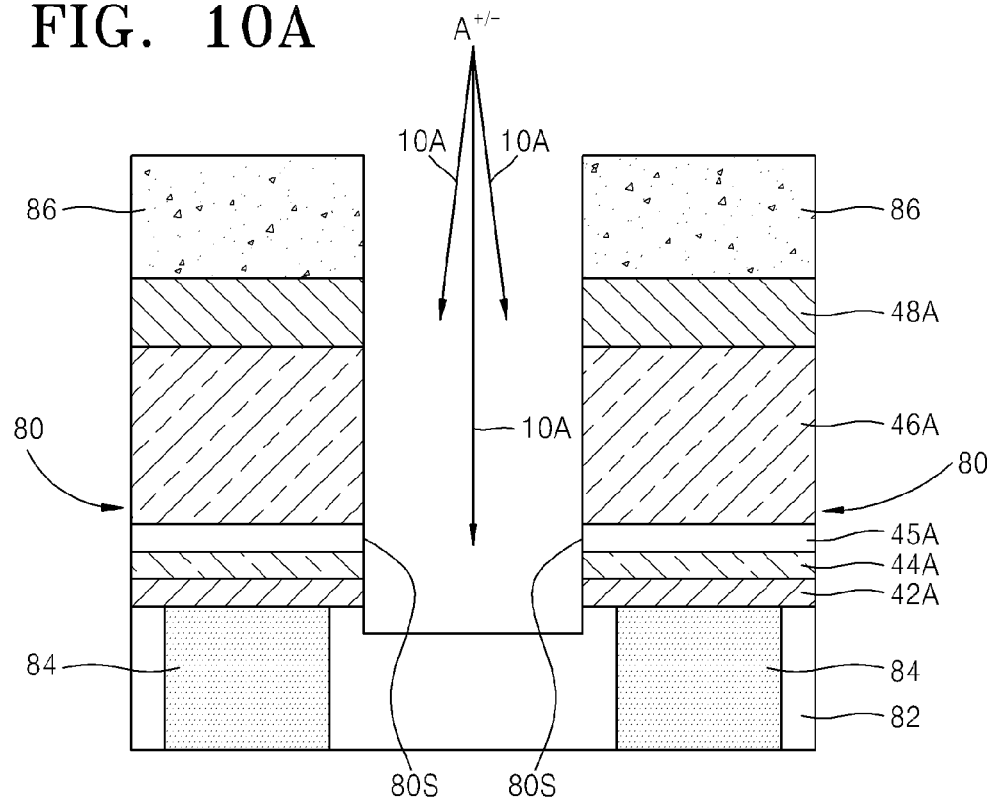
FIG. 10A is a cross-sectional view of movement paths of ions when a stack structure is etched in a condition that a source power and a bias power are output in constant wave modes, respectively.

FIG. 10A illustrates movement paths of ions when the stack structure is etched in a condition that a source power and a bias power are output in a constant wave mode, respectively.

In detail, FIG. 10A illustrates movement paths 10A of accelerated ions $A^{+/-}$ that are generated from the etching gas when the stack structure 40 is etched by the process described with reference to FIG. 8C using the plasma etching apparatus 60 in a condition that the source power and the bias power are output in the constant wave mode illustrated in FIGS. 7A and 7B, respectively.

Figure 10B:
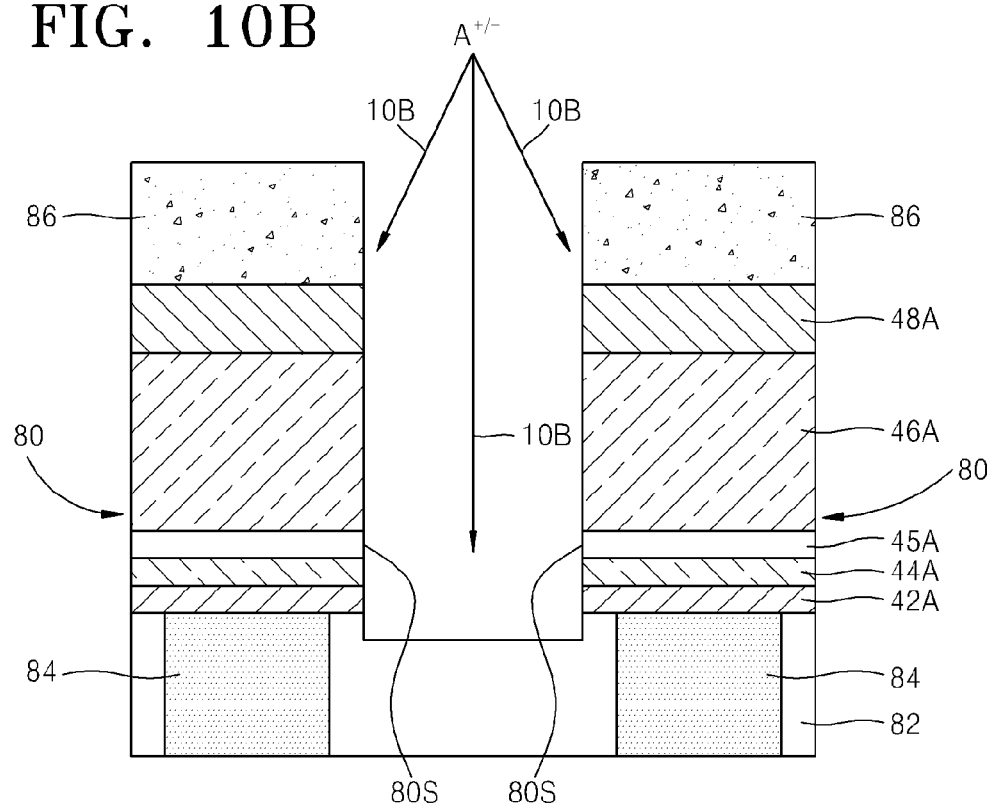
FIG. 10B is a cross-sectional view of movement paths of ions generated from an etching gas in a synchronous pulse plasma etching process.

FIG. 10B illustrates movement paths of ions that are generated from the etching gas in a synchronous pulse plasma etching process.

In detail, FIG. 10B illustrates movement paths 10B of accelerated ions $A^{+/-}$ that are generated from the etching gas when the stack structure 40 is etched by the process described with reference to FIG. 8C using the plasma etching apparatus 60 in a condition that the source power and the bias power are output in the pulsed mode illustrated in FIG. 7E, respectively, thereby performing the synchronous pulse plasma etching process.

As obvious from the result of comparing FIGS. 10A and 10B, when the synchronous pulse plasma etching process is performed, the movement range of the accelerated ions $A^{+/-}$ that are generated from the etching gas increases in comparison with the case in which the source power and the bias power are output in constant wave modes, respectively. Thus, the movement range where the accelerated ions $A^{+/-}$ are dispersed increases. Even when the etching by-products are re-deposited on the sidewalls 80S exposed while the stack structure 40 is etched, the re-deposited by-products may be removed due to the plurality of accelerated ions $A^{+/-}$ that are moved in the increased movement range. Such an effect may apply to an etching process of the stack structure 50 described with reference to FIG. 9C. Thus, even when a stack structure including a plurality of magnetic layers is etched so as to manufacture the magnetic device 80 or 90 having a very fine width of several tens of nm (e.g., 20 nm), the stack structure including the plurality of magnetic layers is etched using the method of manufacturing a magnetic device according to example embodiments so that miniaturized magnetic devices each having a vertical sidewall profile may be easily manufactured due to high anisotropic etching that may be performed without re-deposition of the etching by-products.

Figure 11:
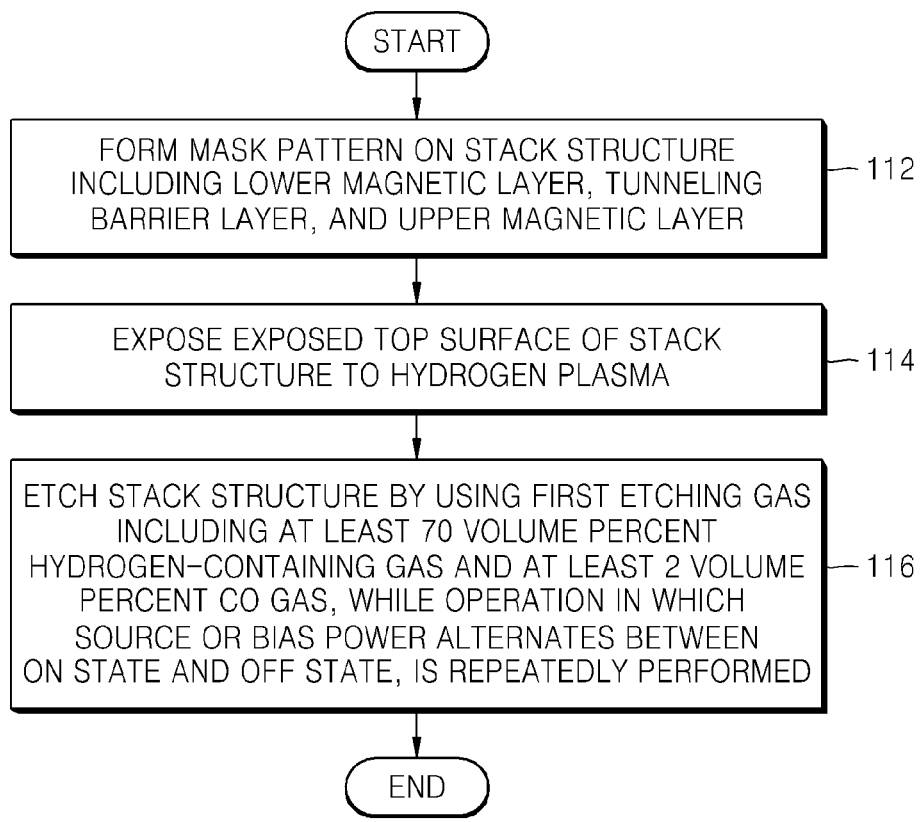
FIG. 11 is a flowchart illustrating a method of manufacturing a magnetic device, according to example embodiments.

FIG. 11 is a flowchart illustrating a method of manufacturing a magnetic device, according to example embodiments.

In operation 112 of FIG. 11, a mask pattern is formed on a stack structure including a lower magnetic layer, a tunneling barrier layer, and an upper magnetic layer, which are sequentially stacked from bottom to top, to cover a portion of the stack structure.

In some example embodiments, the stack structure further includes a lower electrode layer and an upper electrode layer which are formed under and on the lower magnetic layer, the tunneling barrier layer, and the upper magnetic layer interposed between the lower electrode layer and the upper electrode layer. The stack structure may include a magnetic layer formed of at least one selected from Co/Pd, Co/Pt, Co/Ni, Fe/Pd, Fe/Pt, MgO, PtMn, IrMn, a CoFe alloy, a CoFeB alloy and combinations thereof. For example, the stack structure may include the stack structure 40 or 50 of FIG. 4 or 5.

The mask pattern may include at least one material selected from Ru, W, TiN, TaN, Ti, Ta and combinations thereof. In some example embodiments, the mask pattern has a bi-layer structure of Ru\TiN or TiN\W.

In operation 114, in a resultant structure in which the mask pattern is formed, the exposed top surface of the stack structure is exposed to hydrogen plasma, and the stack structure is pre-treated.

In some example embodiments, in order to perform the pre-treatment process using hydrogen plasma, a structure including the stack structure (e.g., a substrate) is loaded into the chamber 62 of the plasma etching apparatus 60 illustrated in FIG. 6, and hydrogen plasma is generated by supplying only $H_2$ gas into the chamber 62. A more detailed description of the pre-treatment process in operation 114 is substantially the same as the pre-treatment process described in operation 22 of FIG. 2A or the pre-treatment process described in operation 32 of FIG. 3A. Thus, a detailed description thereof is omitted. If necessary, operation 114 may be omitted.

In operation 116, the upper magnetic layer, the tunneling barrier layer, and the lower magnetic layer are etched from the exposed top surface of the stack structure by using a first etching gas including at least 70 volume percent of the hydrogen-containing gas and at least 2 volume percent of the CO gas and by using the mask pattern formed in operation 112 as an etching mask, while an operation in which the source or bias power alternates between an on state and an off state is repeatedly performed.

The etching process of operation 116 may be performed using the plasma etching apparatus 60 illustrated in FIG. 6. The etching process of operation 116 may be performed in the same chamber 62 subsequent to the pre-treatment process of operation 114.

The etching process of operation 116 may be performed in the same way as the etching process described in operation 24 of FIG. 2A or the etching process described in operation 34 of FIG. 3A. However, in operation 116, while the etching process of the stack structure is performed, an operation in which the source or bias power alternates between an on state and an off state is repeatedly performed. For example, while the etching process is performed, a source power or a bias power may be output in a pulsed mode in which the source or bias power alternates between an on state and an off state, as illustrated in FIG. 7C or 7D. In some example embodiments, while the etching process is performed, the source power in the pulsed mode and the bias power in the pulsed mode may be output simultaneously, or with a given time difference, in order to perform a synchronous pulse plasma etching process as illustrated in FIG. 7E. The etching process of operation 116 may be performed at a temperature of about $-10°$ C. to $80°$ C. under pressure of about 2 mT to about 5 mT.

The etching process of operation 116 is performed on a plasma etching process condition using the source power in the pulsed mode, the bias power in the pulsed mode, or a combination thereof so that accelerated ions generated from the etching gas are moved within the increased movement range and collide with the region to be etched. In the region to be etched of the stack structure, a chemical reaction with the accelerated hydrogen ions that reach the surface of the region is performed and simultaneously, physical etching due to the accelerated ions obtained from the etching gas may be uniformly performed in the region to be etched. Thus, the hydrogen ions and the accelerated ions are more effectively used in performing high anisotropic etching of a layer to be etched and removing of a re-deposited layer. As a result, fine magnetic resistive devices each having a vertical sidewall profile may be easily formed, and etching by-products may be prevented from being re-deposited on the sidewalls of the patterns obtained after etching.

FIGS. 12A through 12H are cross-sectional views illustrating the order of processes of a method of manufacturing a magnetic device 200 (see FIG. 12H), according to example embodiments.

The present example embodiments illustrate a process of manufacturing a spin transfer torque magnetoresistive random access memory (STT-MRAM) device as a process of manufacturing the magnetic device 200.

Figure 12A:
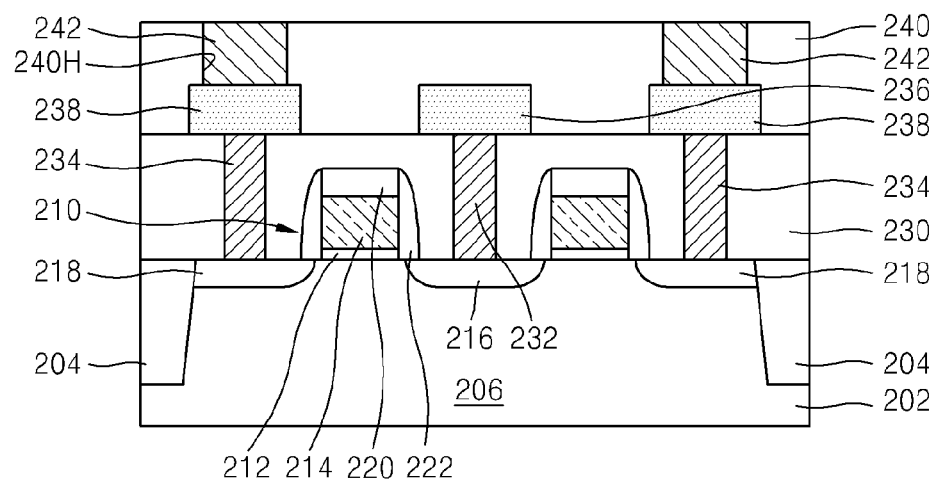
FIGS. 12A through 12H are cross-sectional views illustrating the order of processes of a method of manufacturing a magnetic device, according to example embodiments.

Referring to FIG. 12A, an isolation layer 204 is formed on a substrate 202 to thus define an active region 206, and at least one transistor 210 is formed in the active region 206.

In some example embodiments, the substrate 202 is a semiconductor wafer. In at least one example embodiment, the substrate 202 includes silicon (Si). In some example embodiments, the substrate 202 may include a semiconductor element, (e.g., Ge), or a compound semiconductor (e.g., SiC, GaAs, InAs, or InP). In example embodiments, the substrate 202 may have a silicon on insulator (SOI) structure. For example, the substrate 202 may include a buried oxide (BOX) layer. In some example embodiments, the substrate 202 may include a conductive region (e.g., a well doped with an impurity), or a structure doped with an impurity. The isolation layer 204 may have a shallow trench isolation (STI) structure.

The transistor 210 includes a gate insulating layer 212, a gate electrode 214, a source region 216, and a drain region 218. The gate electrode 214 is formed such that a top surface and both sidewalls of the gate electrode 214 may be insulated by an insulating capping layer 220 and an insulating spacer 222, respectively.

Next, a planarized first interlayer insulating layer 230 configured for covering the transistor 210, a plurality of first contact plugs 232 that penetrate the first interlayer insulating layer 230 and are electrically connected to the source region 216, and a plurality of second contact plugs 234 that are electrically connected to the drain region 218 are formed sequentially on the substrate 202. After a conductive layer is formed on the first interlayer insulating layer 230, the conductive layer is patterned, thereby forming a plurality of source lines 236 that are electrically connected to the source region 216 via the plurality of first contact plugs 232 and a plurality of conductive patterns 238 that are electrically connected to the drain region 218 via the plurality of second contact plugs 234 at both sides of the source lines 236.

Next, a second interlayer insulating layer 240 is formed on the first interlayer insulating layer 230 to cover the source lines 236 and the conductive patterns 238. By using a photolithographic process, a portion of the second interlayer insulating layer 240 is removed to expose a top surface of the conductive patterns 238, thereby forming a lower electrode contact hole 240H. By filling a conductive material in the lower electrode contact hole 240H and by polishing the conductive material to expose a top surface of the second interlayer insulating layer 240, thereby forming a lower electrode contact plug 242. In some example embodiments, the lower electrode contact plug 242 includes at least one material selected from TiN, Ti, TaN, Ta, W and combinations thereof.

Figure 12B:
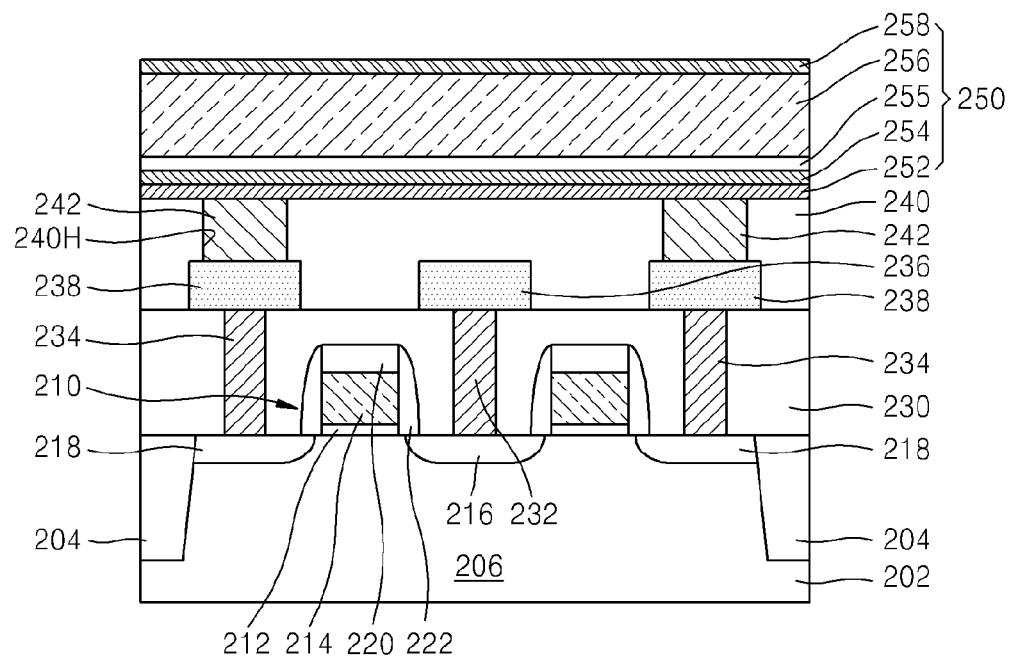

Referring to FIG. 12B, a stack structure 250, in which a lower electrode layer 252, a lower magnetic layer 254, a tunneling barrier layer 255, an upper magnetic layer 256, and an upper electrode layer 258 are sequentially stacked from bottom to top, is formed on the second interlayer insulating layer 240 and the lower electrode contact plug 242.

The stack structure 250 may include the stack structure 40 or 50 of FIG. 4 or 5. However, example embodiments are not limited thereto, and various types of layers may be added or replaced according to desired characteristics of a magnetic device to be formed.

Figure 12C:
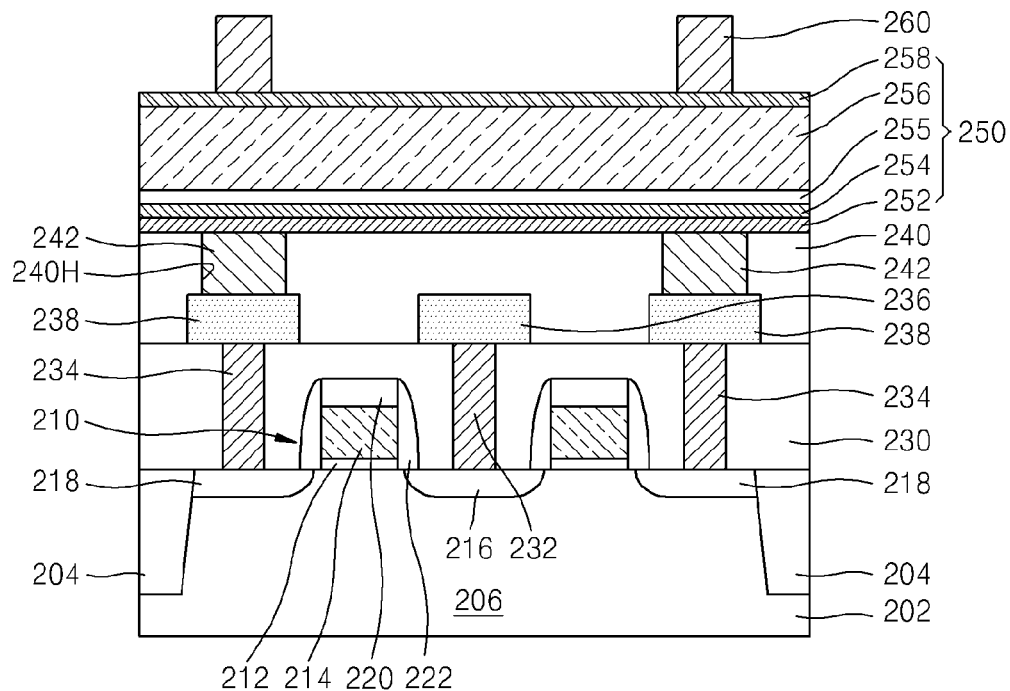

Referring to FIG. 12C, a plurality of conductive mask patterns 260 are formed on the stack structure 250 so as to cover a portion of a top surface of the stack structure 250.

The plurality of conductive mask patterns 260 may include metal or metal nitride. In some example embodiments, the plurality of conductive mask patterns 260 include at least one material selected from Ru, W, TiN, TaN, Ti, Ta and combinations thereof. For example, the conductive mask patterns 260 may have a bi-layer structure of Ru\TiN or TiN\W. The conductive mask patterns 260 are formed on the same axis as that of the lower electrode contact plugs 242.

In some example embodiments, a process may be used whereby a conductive mask layer is first formed on the stack structure 250, a plurality of hard mask patterns (not shown) are formed on the conductive mask layer and the conductive mask layer is etched using the plurality of hard mask patterns as an etching mask so that the plurality of conductive mask patterns 260 remain in order to form the plurality of conductive mask patterns 260.

Figure 12D:
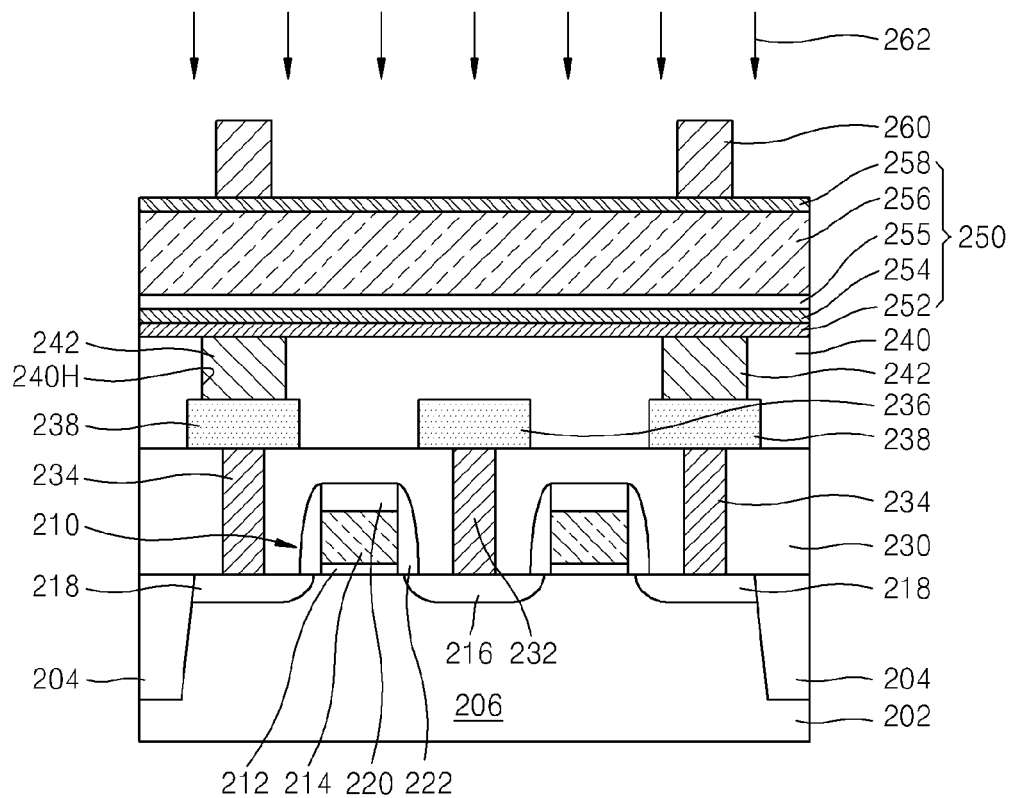

Referring to FIG. 12D, in a resultant structure in which the conductive mask patterns 260 are formed, the exposed top surface of the stack structure 250 is exposed to hydrogen plasma 262 to thus perform pre-treatment on the stack structure 250.

The pre-treatment process using the hydrogen plasma 262 is the same as operation 22 of FIG. 2A, operation 32 of FIG. 3A, and the pre-treatment process using hydrogen plasma described with reference to FIGS. 8B and 9B. The pre-treatment process using the hydrogen plasma 262 may be omitted if necessary.

Figure 12E:
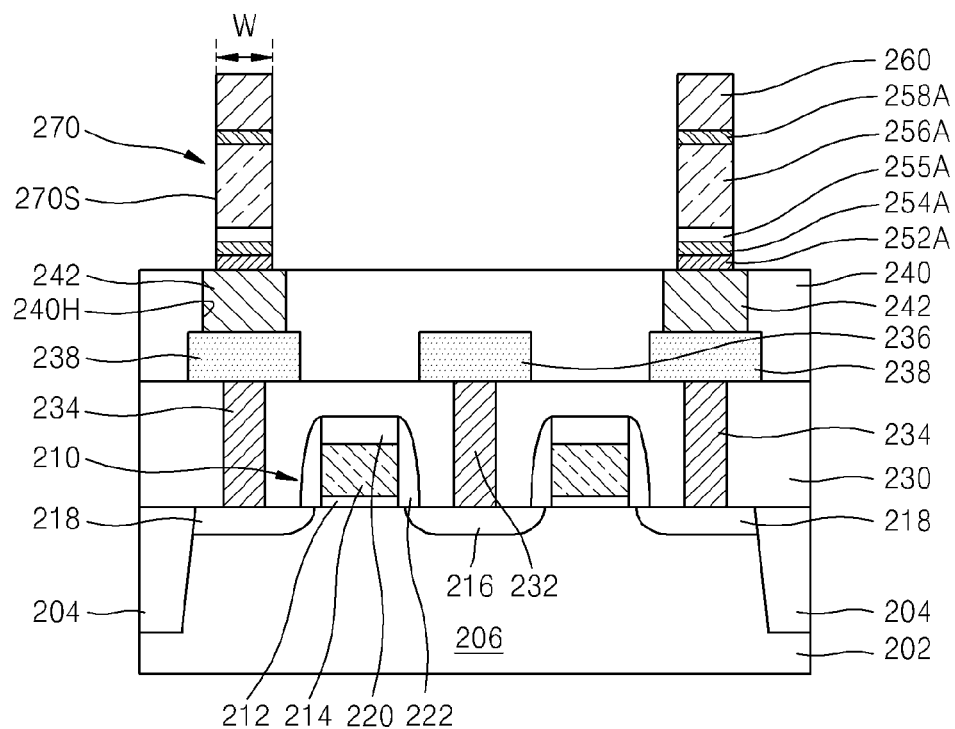

Referring to FIG. 12E, the upper electrode layer 258, the upper magnetic layer 256, the tunneling barrier layer 255, the lower magnetic layer 254, and the lower electrode layer 252 of the stack structure 250 are sequentially etched by using a plasma etching process by using an etching gas including at least 70 volume percent of the hydrogen-containing gas and at least 2 volume percent of the CO gas and by using the conductive mask patterns 260 as an etching mask. As a result, a plurality of upper electrodes 258A, a plurality of upper magnetic layer patterns 256A, a plurality of tunneling barrier layers 255A, a plurality of lower magnetic layer patterns 254A, and a plurality of lower electrodes 252A are formed.

A more detailed description of the etching process of the stack structure 250 can be referred to by operation 116 of FIG. 11. In some example embodiments, the etching process of the stack structure 250 may be performed using the plasma etching apparatus 60 illustrated in FIG. 6. The etching process of the stack structure 250 may be performed in the same chamber 62 subsequent to the pre-treatment process using the hydrogen plasma 262 described with reference to FIG. 12D.

The etching process of the stack structure 250 may be performed in the same way as the etching process described in operation 24 of FIG. 2A or the etching process described in operation 34 of FIG. 3A. In some example embodiments, while the etching process of the stack structure 250 is performed, an operation in which the source or bias power alternates between an on state and an off state is repeatedly performed. For example, while the etching process is performed, a source power or a bias power may be output in a pulsed mode in which the source or bias power alternates between an on state and an off state, as illustrated in FIG. 7C or 7D. In some example embodiments, while the etching process is performed, the source power in the pulsed mode and the bias power in the pulsed mode may be output simultaneously, or with a given time difference, in order to perform a synchronous pulse plasma etching process as illustrated in FIG. 7E. The etching process of the stack structure 250 may be performed at a temperature of about −10° C. to 80° C. under pressure of about 2 mT to about 5 mT.

While the etching process of the stack structure 250 is performed, portions of the plurality of conductive mask patterns 260 may be consumed from their top surfaces. Although not shown, a second interlayer insulating layer 240 exposed after the plurality of lower electrodes 252A are formed by etching of the stack structure 250, may be etched from a top surface of the second interlayer insulating layer 240 by a given thickness.

As a resultant structure formed by etching the stack structure 250, a plurality of magnetic resistive devices 270 including the lower electrodes 252A, the lower magnetic layer patterns 254A, the tunneling barrier layers 255A, the upper magnetic layer patterns 256A, the upper electrodes 258A, and the remaining conductive mask patterns 260 are formed on the plurality of lower electrode contact plugs 242. In the plurality of magnetic resistive devices 270, the remaining conductive mask patterns 260 and the upper electrodes 258A may be configured as one electrode.

The plurality of magnetic resistive devices 270 are formed by an etching process using an etching gas including at least 70 volume percent of the hydrogen-containing gas and at least 2 volume percent of the CO gas, and thus having sidewalls 270S having a vertical sidewall profile. In addition, while the etching process of FIG. 12E is performed, etching residuals (e.g., non-volatile materials) are prevented from being re-deposited on the sidewalls 270S of the magnetic resistive devices 270. Thus, deterioration of characteristics of the magnetic resistive devices 270 due to by-products re-deposited on the sidewalls 270S may be prevented.

In addition, even when a width W of each of the plurality of magnetic resistive devices 270 has a very fine size of several tens of nm (e.g., 20 nm), high anisotropic etching may be performed on the stack structure 250 without re-deposition of the etching by-products so that fine magnetic devices each having a vertical sidewall profile may be easily manufactured and the magnetic resistive devices 270 each having a large aspect ratio may be easily formed. In some example embodiments, a width of the tunneling barrier layer 255A is set as a base for the width W of the magnetic resistive device 270. The tunneling barrier layer 255A of the magnetic resistive device 270 may have a width that is not greater than 20 nm. For example, the tunneling barrier layer 255A may have a width of about 10 to 20 nm.

Figure 12F:
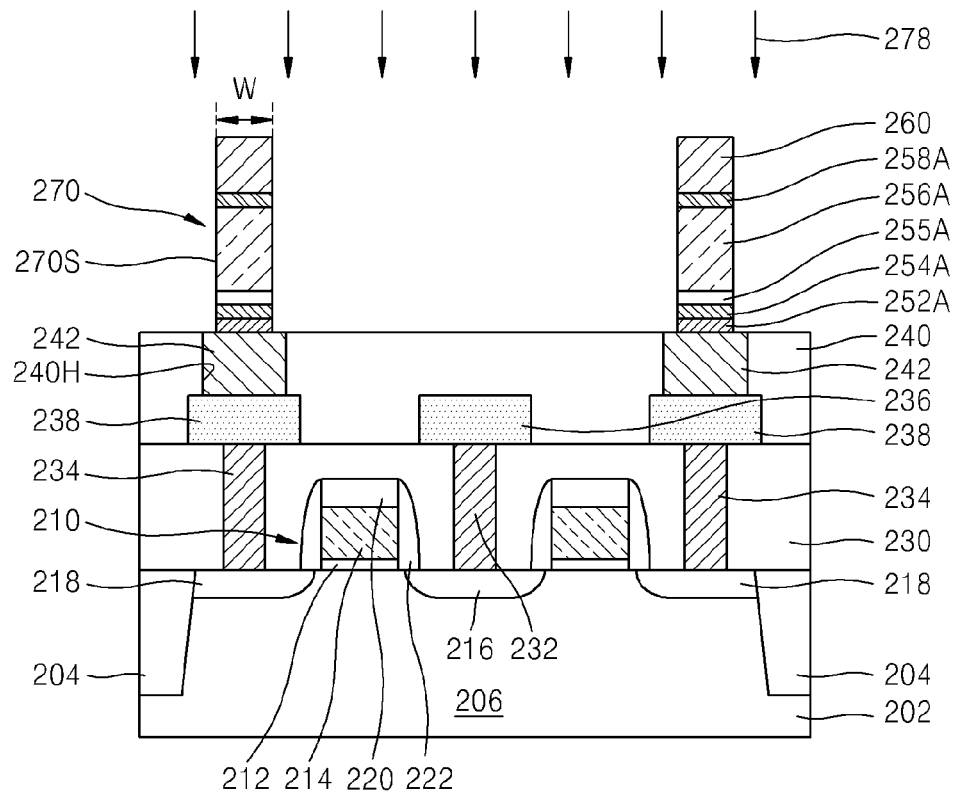

Referring to FIG. 12F, a post-treatment process of exposing a resultant structure in which the plurality of magnetic resistive devices 270 are formed to oxygen plasma 278 is performed.

When conductive residuals remain on the sidewalls of the plurality of magnetic resistive devices 270, the conductive residuals may be oxidized and changed into an insulating layer due to the post-treatment process using the oxygen plasma 278. Thus, even when the conductive residuals remain on the sidewalls of the plurality of magnetic resistive devices 270 after the plurality of magnetic resistive devices 270 has been formed, the occurrence of the problem (e.g., electrical short caused by the conductive residuals) may be prevented.

If necessary, the post-treatment process using the hydrogen plasma 278 may be omitted.

Figure 12G:
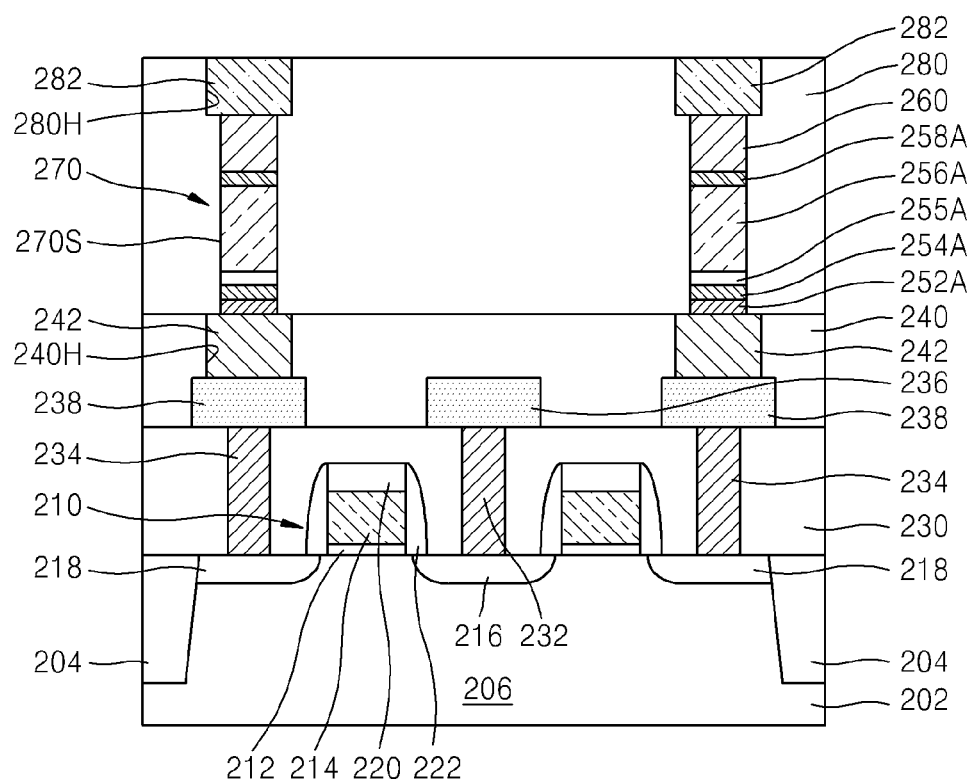

Referring to FIG. 12G, a planarized third interlayer insulating layer 280 is formed to cover the plurality of magnetic resistive devices 270, and a portion of the third interlayer insulating layer 280 is removed by etching to form a plurality of bit line contact holes 280H that expose a top surface of the conductive mask pattern 260 of each magnetic resistive device 270. Next, after a conductive layer for filling the plurality of bit line contact holes 280H is formed, the conductive layer is polished or etched until a top surface of the third interlayer insulating layer 280 is exposed, thereby forming a plurality of bit line contact plugs 282 in the plurality of bit line contact holes 280H, respectively.

Figure 12H:
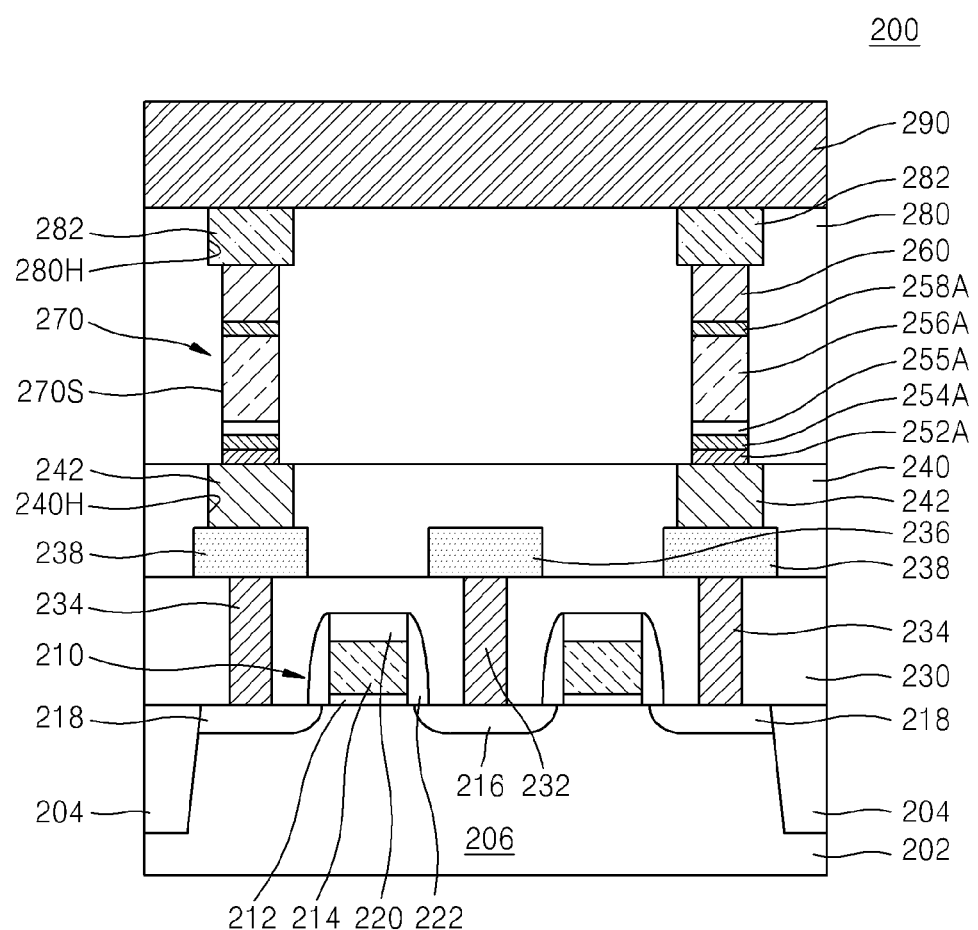

Referring to FIG. 12H, a conductive layer is formed on the third interlayer insulating layer 280 and the plurality of bit line contact plugs 282, and the conductive layer is patterned, thereby forming bit lines 290 having a linear shape that are electrically connected to the plurality of bit line contact plugs 282, respectively, to form the magnetic device 200.

Figure 13A:
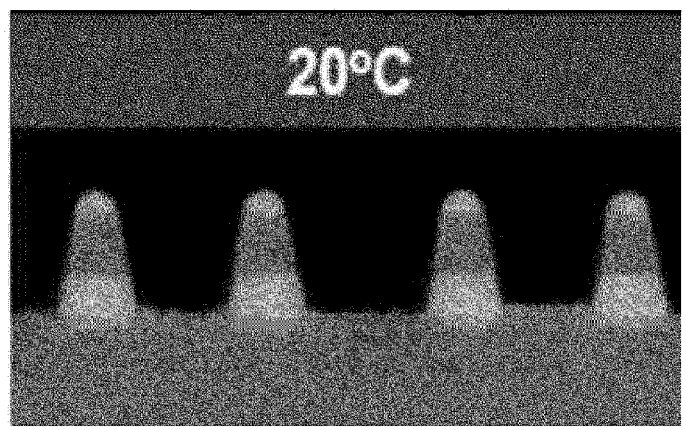
FIGS. 13A through 13C are virtual scanning electron microscope (VSEM) photos showing an evaluation result of dependency of an etching atmosphere temperature when a stack structure including a magnetic layer is etched from using a method of manufacturing a magnetic device, according to example embodiments.
Figure 13B:
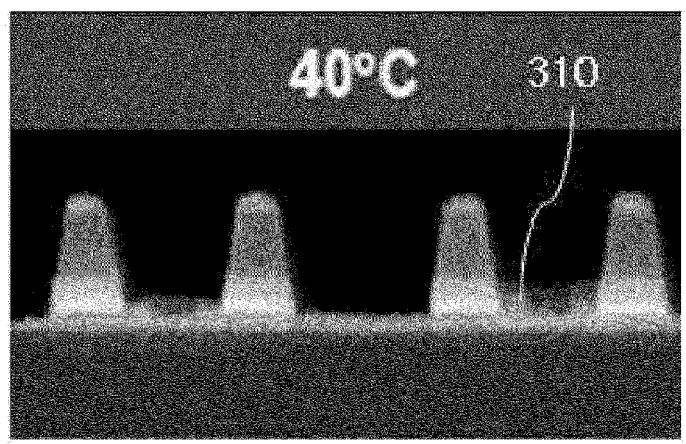
Figure 13C:
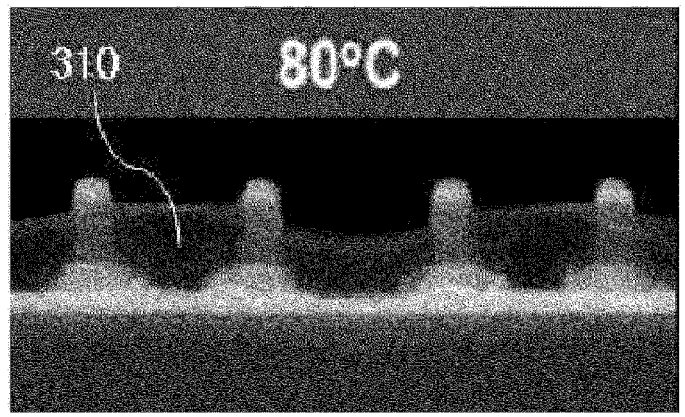

FIGS. 13A through 13C are virtual scanning electron microscope (VSEM) photos showing an evaluation result of dependency of an etching atmosphere temperature when a stack structure including a magnetic layer is etched from using a method of manufacturing a magnetic device, according to example embodiments.

For the evaluation of FIGS. 13A through 13C, a stack structure of Ti (20)\Ru (20)\Ta (4)\CoFeB (11)\MgO (10)\CoFeB (12)\Ta (4)\Co (5)\Pt (10)\[Co (2.5)\Pd (10)]×3\Co (5)\Ru (8)\Co (5)\[Pd (10)\Co (2.5)]×7\Pd (10)\Ti (10)\Ru (50) (where a number in the parenthesis represents a thickness in Å), which are sequentially stacked from bottom to top, was used. In order to etch the stack structure, conductive mask patterns having a structure of Ru (500)\TiN (600) were formed on the stack structure, and the stack structure was etched using the conductive mask patterns as an etching mask. 80 volume percent of the $CH_4$ gas and 20 volume percent of the CO gas were used as an etching gas for etching the stack structure, and the plasma etching apparatus 60 using an ICP method as illustrated in FIG. 6 was used.

In order to control the etching temperature, the temperature of the bias electrode 64 of the plasma etching apparatus 60 was controlled. FIGS. 13A through 13C illustrate cases where the temperature of the bias electrode 64 was set to 20° C., 40° C., and 80° C., respectively.

In FIGS. 13A through 13C, a process pressure, a source power, and a bias power were set to 2 mT, 500 W, and 350 W, respectively.

In FIGS. 13A through 13C, as the etching temperature is decreased, the amount of etching by-products re-deposited on sidewalls of a pattern obtained after etching is decreased, and the amount of polymer by-products 310 having a main ingredient of carbon is also decreased. Thus, the lower the etching temperature is, the easier a desired etching resultant structure is obtained.

Figure 14:
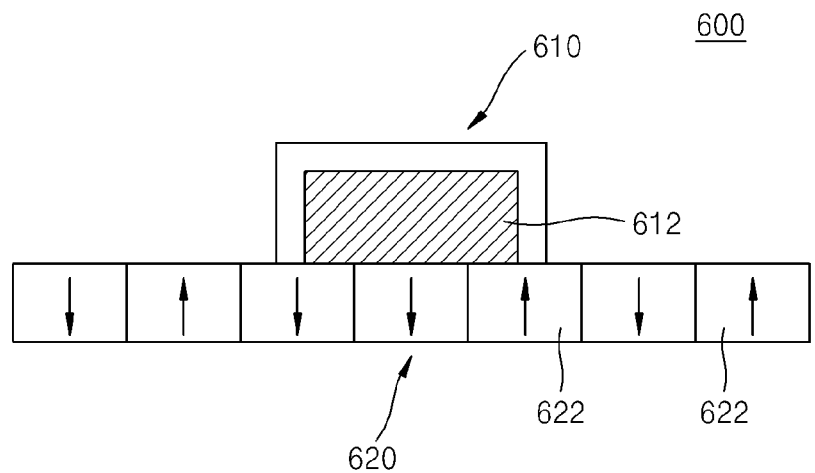
FIG. 14 is a schematic cross-sectional view of a magnetic device that may be implemented by using a method of manufacturing a magnetic device, according to example embodiments.

FIG. 14 is a schematic cross-sectional view of a magnetic device that may be implemented by using a method of manufacturing a magnetic device, according to example embodiments.

Referring to FIG. 14, a magnetic device 600 includes a recording head 610 of a hard disk drive (HDD). The recording head 610 includes an MTJ device 612.

Data is recorded in each domain 622 of a recording medium 620 due to perpendicular magnetic polarization, as indicated by arrows. The recording head 610 may record data on the recording medium 620, or may read recorded data from the recording medium 620. The method of manufacturing a magnetic device according to example embodiments may apply to forming the MTJ device 612 of the recording head 610.

Figure 15:
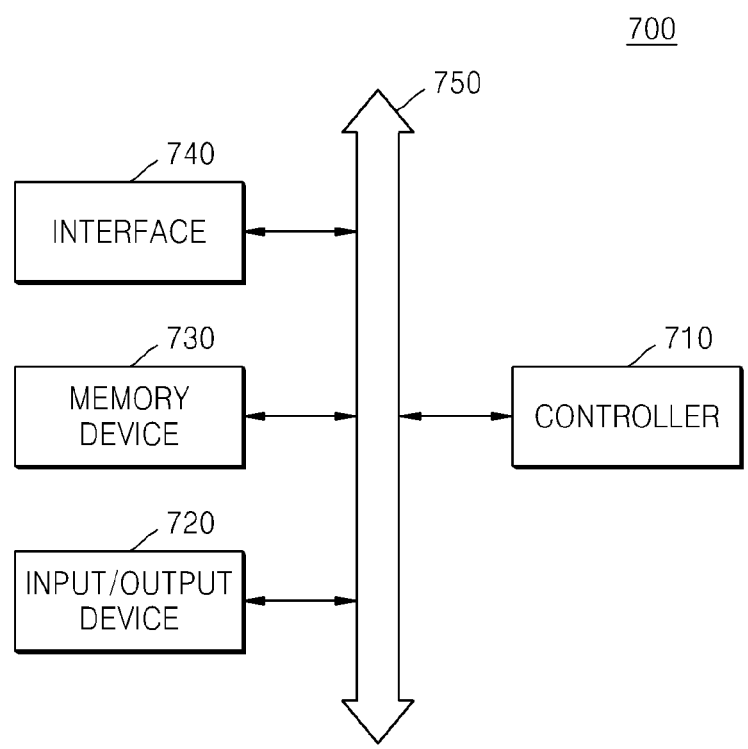
FIG. 15 illustrates a system that may be implemented by using a method of manufacturing a magnetic device, according to example embodiments.

FIG. 15 illustrates a system that may be implemented by using a method of manufacturing a magnetic device, according to example embodiments.

Referring to FIG. 15, a system 700 includes a controller 710, an input/output device 720, a memory device 730, and an interface 740. The system 700 may be a mobile system or a system for transmitting or receiving information. In some example embodiments, the mobile system is a personal digital assistant (PDA), a portable computer, a web tablet, a wireless phone, a mobile phone, a digital music player, or a memory card. The controller 710 controls an execution program in the system 700 and may include a microprocessor, a digital signal processor, a microcontroller, or the like. The input/output device 720 may be used in inputting or outputting data from or to the system 700. The system 700 may be connected to an external device (e.g., a personal computer (PC) or a network) by using the input/output device 720 and may exchange data with the external device. The input/output device 720 may be a keypad, a keyboard, or a display, for example.

The memory device 730 may store a code and/or data for an operation of the controller 710, or may store data processed by the controller 710. The memory device 730 includes a magnetic device that is manufactured by a method of manufacturing a magnetic device according to example embodiments.

The interface 740 may be a data transmission path between the system 700 and another external device (not shown). The controller 710, the input/output device 720, the memory device 730, and the interface 740 may communicate with each other via a bus 750. The system 700 may be used in a mobile phone, an MP3 player, a navigation device, a portable multimedia player (PMP), a solid state disk (SSD), or household appliances.

Figure 16:
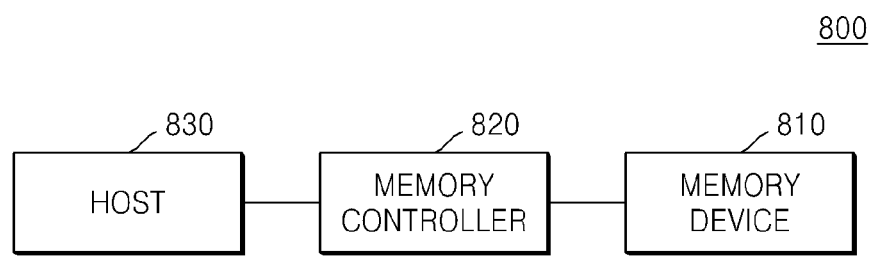
FIG. 16 illustrates a memory card that may be implemented by using a method of manufacturing a magnetic device, according to example embodiments.

FIG. 16 illustrates a memory card that may be implemented by using a method of manufacturing a magnetic device, according to example embodiments.

Referring to FIG. 16, a memory card 800 includes a memory device 810 and a memory controller 820.

The memory device 810 may store data. In some example embodiments, the memory device 810 has non-volatile characteristics wherein stored data may be retained even when a supply of power stops. The memory device 810 includes a magnetic device that is manufactured by a method of manufacturing a magnetic device according to example embodiments.

The memory controller 820 may read stored data from the memory device 810, or may store data in the memory device 810, in response to a read/write request of a host 830.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of manufacturing a magnetic device, the method comprising:
    etching a stack structure including at least one magnetic layer by using an etching gas including at least 70 volume percent of a hydrogen-containing gas and at least 2 volume percent of CO gas;
    wherein the hydrogen-containing gas includes at least one selected from $CH_4$ gas, $H_2$ gas and a combination thereof.

2. The method of claim 1, wherein the hydrogen-containing gas is $CH_4$ gas, and
    the etching gas includes about 70 to about 98 volume percent of the $CH_4$ gas and about 2 to about 30 volume percent of the CO gas.

3. The method of claim 1, wherein the hydrogen-containing gas is $H_2$, and
    the etching gas includes about 70 to about 98 volume percent of the $H_2$ gas and 2 to 30 volume percent of the CO gas.

4. The method of claim 1, wherein the etching gas further includes an additional gas including at least one selected from He, Ne, Ar, Kr, Xe and combinations thereof.

5. The method of claim 1, wherein the etching of the stack structure is performed at a temperature of about −10° C. to about 20° C.

6. The method of claim 1, wherein halogen elements are excluded from the etching gas.

7. The method of claim 1, wherein the stack structure includes at least one selected from Co/Pd, Co/Pt, Co/Ni, Fe/Pd, Fe/Pt, MgO, PtMn, IrMn, a CoFe alloy, a CoFeB alloy and combinations thereof.

8. The method of claim 1, wherein the etching of the stack structure includes,
    plasma etching using a plasma etching apparatus including a source power output unit configured for applying a source power and a bias power output unit configured for applying a bias power, and
    repeatedly alternating at least one power of the source power and the bias power between an on state and an off state.

9. The method of claim 1, wherein the etching of the stack structure includes,
    plasma etching using a plasma etching apparatus including a source power output unit configured for applying a source power and a bias power output unit configured for applying a bias power, and
    applying the source power in a constant mode and the bias power in a pulsed mode alternating between an on state and an off state.

10. The method of claim 1, further comprising:
    exposing a region to be etched of the stack structure to a hydrogen plasma prior to the etching the stack structure.

11. The method of claim 1, wherein the stack structure includes a lower magnetic layer, a tunneling barrier layer, and an upper magnetic layer, which are sequentially stacked, and
    the etching of the stack structure includes plasma etching the lower magnetic layer, the tunneling barrier layer, and the upper magnetic layer, respectively, using the etching gas to form a magnetic resistive device.

12. The method of claim 11, further comprising:
    forming a mask pattern on the stack structure,
    wherein the etching of the stack structure includes using the mask pattern as an etching mask.

13. The method of claim 11, further comprising:
    exposing an exposed surface of the magnetic resistive device to an oxygen plasma, after the etching of the stack structure.

14. A method of manufacturing a magnetic device, comprising:
    forming a stack structure including at least one magnetic layer; and
    etching the at least one magnetic layer by exposing the at least one magnetic layer to an etching gas including at least 70 volume percent of a hydrogen-containing gas and at least 2 volume percent of CO gas:
    wherein the hydrogen-containing gas includes at least one selected from $CH_4$ gas, $H_2$ gas and a combination thereof.

15. The method of claim 14, wherein the at least one magnetic layer includes at least one selected from Pt, Pd, Ni, Mn, Co, Mg, Fe, Ir and combinations thereof.

16. The method of claim 14, wherein the removing of the portion of the at least one magnetic layer forms a plurality of magnetic resistive devices each having a width of about 20 nm or less.

17. The method of claim 14, wherein the etching gas includes at least 80 volume percent of the hydrogen-containing gas and at least 10 volume percent of the CO gas.

18. The method of claim 14, wherein the at least one magnetic layer includes a perpendicular magnetic anisotropy material.

* * * * *